United States Patent
Hsiang et al.

(10) Patent No.: US 10,475,850 B2
(45) Date of Patent: Nov. 12, 2019

(54) DISPLAY DEVICES AND METHODS OF MANUFACTURING THE SAME

(71) Applicant: Acer Incorporated, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/806,752

(22) Filed: Nov. 8, 2017

(65) Prior Publication Data

US 2018/0294311 A1 Oct. 11, 2018

(30) Foreign Application Priority Data

Apr. 6, 2017 (TW) .............................. 106111523 A

(51) Int. Cl.
*H01L 21/00* (2006.01)
*H01L 27/15* (2006.01)
(Continued)

(52) U.S. Cl.
CPC ............. *H01L 27/156* (2013.01); *G09G 3/32* (2013.01); *G09G 3/3208* (2013.01); *H01L 27/124* (2013.01); *H01L 27/1248* (2013.01); *H01L 27/1262* (2013.01); *H01L 33/0075* (2013.01); *H01L 33/0079* (2013.01);
(Continued)

(58) Field of Classification Search
None
See application file for complete search history.

(56) References Cited

U.S. PATENT DOCUMENTS

2016/0204185 A1\* 7/2016 Iijima .................. H01L 27/3276
257/91
2017/0025589 A1\* 1/2017 Chang ..................... H01L 33/56
(Continued)

FOREIGN PATENT DOCUMENTS

TW 201702706 A 1/2017
TW 201712901 A 4/2017
(Continued)

OTHER PUBLICATIONS

European Search Report dated Jan. 17, 2018, issued in application No. 17201109.0-1211.
(Continued)

*Primary Examiner* — Reema Patel
(74) *Attorney, Agent, or Firm* — McClure, Qualey & Rodack, LLP

(57) ABSTRACT

A display device includes a substrate, and a first light-emitting diode element disposed over the substrate and having a first light-emitting path. The display device further includes a light-emitting angle changing layer disposed over the first light-emitting diode element. The display device further includes a second light-emitting diode element disposed over the substrate. The second light-emitting diode element is disposed at a position other than the region corresponding to the first light-emitting path. The first light-emitting diode element has a first light-emitting angle, the second light-emitting diode element has a second light-emitting angle, and the second light-emitting angle is greater than the first light-emitting angle.

2 Claims, 17 Drawing Sheets

(51) Int. Cl.
  *G09G 3/32* (2016.01)
  *H01L 33/58* (2010.01)
  *H01L 27/12* (2006.01)
  *H01L 33/00* (2010.01)
  *H01L 33/44* (2010.01)
  *G09G 3/3208* (2016.01)
  *H01L 25/075* (2006.01)
  *H01L 33/06* (2010.01)
  *H01L 33/32* (2010.01)
  *H01L 33/40* (2010.01)

(52) U.S. Cl.
  CPC .............. *H01L 33/44* (2013.01); *H01L 33/58* (2013.01); *G09G 2300/0426* (2013.01); *G09G 2300/0443* (2013.01); *G09G 2300/0447* (2013.01); *H01L 25/0753* (2013.01); *H01L 33/06* (2013.01); *H01L 33/32* (2013.01); *H01L 33/40* (2013.01); *H01L 2933/0016* (2013.01); *H01L 2933/0025* (2013.01); *H01L 2933/0066* (2013.01)

(56) References Cited

U.S. PATENT DOCUMENTS

2017/0033323 A1    2/2017   Chida
2017/0316736 A1*   11/2017   Hughes ................ G09G 3/32

FOREIGN PATENT DOCUMENTS

WO     2009/081325 A1    7/2009
WO     2016/062834 A2    4/2016

OTHER PUBLICATIONS

Chinese language office action dated Aug. 1, 2017, issued in application No. TW 106111523.

* cited by examiner

DISPLAY DEVICES AND METHODS OF MANUFACTURING THE SAME

CROSS REFERENCE TO RELATED APPLICATIONS

This application claims priority of Taiwan Patent Application No. 106111523, filed on Apr. 6, 2017, the entirety of which is incorporated by reference herein.

BACKGROUND

Technical Field

The disclosure relates to display devices, and in particular to display devices with light-emitting diode elements.

Description of the Related Art

As digital technology develops, display devices are becoming more widely used in our society. For example, display devices have been applied in modern information and communication devices such as televisions, notebook computers, desktop computers, mobile phones, and smartphones. In addition, each generation of display devices has been developed to be thinner, lighter, smaller, and more fashionable. The display devices include light-emitting diode display devices.

The recombination radiation of electron and hole in a light-emitting diode may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors.

Since the light-emitting diode display devices are used widely today, any increase in the function of the light-emitting diode display device will result in huge economic benefits. However, existing display devices have not been satisfactory in every respect. Therefore, light-emitting diode display devices which have more functions are still needed.

SUMMARY

Some embodiments of the present disclosure provide a display device. The display device includes a substrate, a first light-emitting diode element disposed over the substrate and having a first light-emitting path, a light-emitting angle changing layer disposed over the first light-emitting diode element, and a second light-emitting diode element disposed over the substrate and disposed at a position other than the region corresponding to the first light-emitting path, wherein the first light-emitting diode element has a first light-emitting angle, and the second light-emitting diode element has a second light-emitting angle, and the second light-emitting angle is greater than the first light-emitting angle.

Some embodiments of the present disclosure further provide a method of manufacturing a display device. The method includes providing a substrate, forming or placing a first light-emitting diode element over the substrate, wherein the first light-emitting diode element has a first light-emitting path. The method also includes forming a light-emitting angle changing layer over the first light-emitting diode element, and placing a second light-emitting diode element over the substrate, wherein the second light-emitting diode element is at a position other than the region corresponding to the first light-emitting path. The first light-emitting diode element has a first light-emitting angle, the second light-emitting diode element has a second light-emitting angle, and the second light-emitting angle is greater than the first light-emitting angle.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
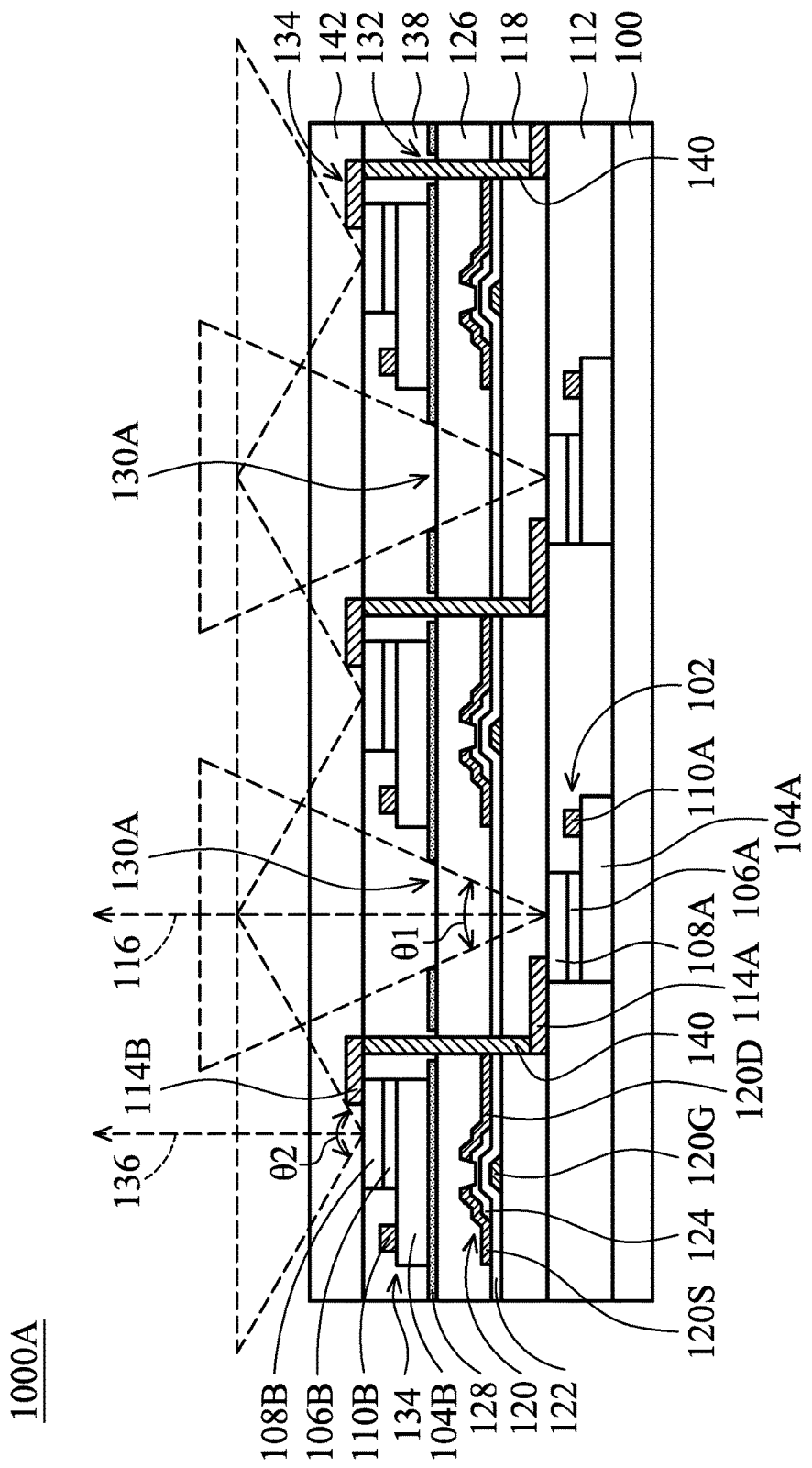
FIG. 1A is a cross-sectional view of a display device in accordance with some embodiments of the present disclosure.

The display device and the method of manufacturing the same of some embodiments of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

The some embodiments of the present disclosure give the display devices of the ability to switch between wide and narrow viewing angles by disposing two light-emitting diode elements having different light-emitting angles in the display devices. In addition, the some embodiments of the present disclosure further give the display devices of the ability to display 3D image by disposing the two light-emitting diode elements at two different layers respectively in the display device.

First, referring to FIG. 1A, FIG. 1A is a cross-sectional view of a display device in accordance with some embodiments of the present disclosure. As shown in FIG. 1A, a substrate 100 is provided. In some embodiments of the present disclosure, the substrate 100 may be a sapphire substrate. The subsequent light-emitting diode element may be directly formed over the sapphire substrate. In some other embodiments of the present disclosure, the substrate 100 may be a flexible substrate, glass substrate, ceramic substrate, plastic substrate, or any other suitable substrate. The subsequent light-emitting diode element may be firstly formed over another sapphire substrate, and then the resulted light-emitting diode element is placed over the substrate 100.

Next, still referring to FIG. 1A, at least one first light-emitting diode element 102 is formed or placed over the substrate 100. As described in preceding paragraph, when the substrate 100 is a sapphire substrate 100, the light-emitting diode element 102 may be formed over the sapphire substrate 100. While the substrate 100 is other substrates, the first light-emitting diode element 102 may be firstly formed over another sapphire substrate and then be placed over the substrate 100.

As shown in FIG. 1A, the first light-emitting diode element 102 includes a first semiconductor layer 104A disposed over substrate 100. The first semiconductor layer 104A has a first conductive type. The first semiconductor layer 104A may include doped or un-doped GaN, InN, AlN, $In_xGa_{(1-x)}N$, $Al_xIn_{(1-x)}N$, $Al_xIn_yGa_{(1-x-y)}N$, or the like, wherein $0 \leq x \leq 1$, $0 \leq y \leq 1$ and $0 \leq (x+y) \leq 1$. The first semiconductor layer 104A may be a p-type semiconductor layer or an n-type semiconductor layer, and may be formed by an epitaxial growth process such as molecular beam epitaxy (MBE), metalorganic chemical vapor deposition (MOCVD), hydride vapor phase epitaxy (HVPE), liquid phase epitaxy (LPE) or the like.

Still referring to FIG. 1A, the first light-emitting diode element 102 further includes an active layer 106A disposed over the first semiconductor layer 104A. The active layer 106A may include homojunction, heterojunction, single-quantum well (SQW), multiple-quantum well (MQW) or the like. In an embodiment of the present disclosure, active layer 106A may include un-doped n-type $In_xGa_{(1-x)}N$. In other embodiments of the present disclosure, the active layer 106 may include other commonly used materials such as $Al_xIn_yGa_{(1-x-y)}N$. In other embodiments of the present disclosure, active layer 106 may be an MQW structure which includes MQW layers (such as InGaN) and barrier layers (such as GaN) arranged alternately. Moreover, the method of forming the active layer 106A may include MOCVD, MBE, HVPE, LPE or any other suitable CVD process. In an embodiment of the present disclosure, the active layer 106A covers a portion of the first semiconductor layer 104A.

Still referring to FIG. 1A, the first light-emitting diode element 102 further includes a second semiconductor layer 108A disposed over the active layer 106A. The second semiconductor layer 108A has a second conductive type that is different from the first conductive type. The second semiconductor layer 108A may include doped or un-doped GaN, InN, AlN, $In_xGa_{(1-x)}N$, $Al_xIn_{(1-x)}N$, $Al_xIn_yGa_{(1-x-y)}N$, or the like, in which $0 \leq x \leq 1$, $0 \leq y \leq 1$ and $0 \leq (x+y) \leq 1$. The second semiconductor layer 108A may be a p-type semiconductor layer or an n-type semiconductor layer, and may be formed by an epitaxial growth process such as MBE, MOCVD, HVPE, LPE or the like.

Still referring to FIG. 1A, the first light-emitting diode element 102 further includes a lower electrode 110A. The lower electrode 110A is electrically connected to the first semiconductor layer 104A. The lower electrode 110A may be disposed at any position where the lower electrode 110A is electrically connected to the first semiconductor layer 104A. In some embodiments of the present disclosure, the lower electrode 110A is disposed over a portion of the first semiconductor layer 104A that is exposed from the active layer 106A and the second semiconductor layer 108A. In some embodiments of the present disclosure, the lower electrode 110A is coupled (or electrically connected) to a first common voltage Vcom1. In other words, the first semiconductor layer 104A of the first light-emitting diode element 102 is coupled to the first common voltage Vcom1. This section will be described in detail in FIG. 1B.

In some embodiments of the present disclosure, the lower electrode 110A may be a single layer or multiple layers of gold, chromium, nickel, platinum, titanium, aluminum, iridium, rhodium, a combination thereof, or any other metal material with good conductivity. The lower electrode 110A may be formed by deposition and patterning processes. The deposition process may include CVD, sputtering, resistive thermal evaporation, electron beam evaporation, or any other suitable deposition methods.

Next, still referring to FIG. 1A, an insulating layer 112 is formed over the substrate 110. The insulating layer 112 surrounds the first light-emitting diode element 102. In some embodiments of the present disclosure, the insulating layer 112 may be silicon dioxide, silicon nitride, silicon oxynitride, or any other suitable material. The insulating layer 112 may be formed by CVD or spin-on coating. The CVD is, for example, low-pressure chemical vapor deposition (LP-CVD), low-temperature chemical vapor deposition (LTCVD), rapid thermal chemical vapor deposition (RTCVD), plasma enhanced chemical vapor deposition (PECVD), atomic layer deposition (ALD), or any other commonly used method.

Next, still referring to FIG. 1A, an upper electrode 114A of the first light-emitting diode element 102 is formed over the insulating layer 112 and the second semiconductor layer 108A. In other words, the first light-emitting diode element 102 further includes the upper electrode 114A. The upper electrode 114A is electrically connected to the second semiconductor layer 108A. The upper electrode 114A may be disposed at any position where the upper electrode 114A is electrically connected to the second semiconductor layer 108A.

In some embodiments of the present disclosure, the first light-emitting diode element 102 can emit light by applying a voltage to the lower electrode 110A and/or the upper electrode 114A of the first light-emitting diode element 102. In addition, as shown in FIG. 1A, the light being emitted from the first light-emitting diode element 102 has a first light-emitting path 116.

Next, still referring to FIG. 1A, an insulating layer 118 is formed over the insulating layer 112, and the insulating layer 118 covers the first light-emitting diode element 102. The insulating layer 118 may be silicon dioxide, silicon nitride, silicon oxynitride, or any other suitable material. The insulating layer 118 may be formed by CVD or spin-on coating as described previously.

Next, still referring to FIG. 1A, a transistor 120 is formed over the insulating layer 118. The transistor 120 is, for example, a thin film transistor. The transistor 120 includes a gate electrode 120G disposed over the insulating layer 118, a gate dielectric layer 122 disposed over the insulating layer 118 and covering the gate electrode 120G. The transistor 120 further includes a semiconductor layer 124 disposed over the gate dielectric layer 122, and a source electrode 120S and a drain electrode 120D disposed on two sides of the semiconductor layer 124, respectively. The semiconductor layer 124 overlaps the gate electrode 120G, and the source electrode 120S and drain electrode 120D overlap portions of the two respective sides of the semiconductor layer 124.

The gate electrode 120G may be amorphous silicon, polysilicon, one or more metals, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The gate electrode 120G may be formed by the previously described CVD, sputtering, resistive thermal evaporation, electron beam evaporation, or any other suitable deposition method.

The gate dielectric layer 122 may be silicon oxide, silicon nitride, silicon oxynitride, high-k dielectric material, any other suitable dielectric material, or a combination thereof. The high-k dielectric material may be metal oxide, metal nitride, metal silicide, transition metal oxide, transition metal nitride, transition metal silicide, metal oxynitride, metal aluminate, zirconium silicate, or zirconium aluminate. For example, the high-k dielectric material may be LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfSiO, HfTaTiO, HfAlON, (Ba,Sr)$TiO_3$(BST), $Al_2O_3$, any other suitable high-k dielectric material, or a combination thereof. The gate dielectric layer 122 may be formed by CVD or spin-on coating as described previously.

The semiconductor layer 124 may include an element semiconductor which includes silicon and/or germanium; a compound semiconductor which includes gallium nitride (GaN), silicon carbide, gallium arsenide, gallium phosphide, indium phosphide, indium arsenide and/or indium antimonide; or an alloy semiconductor which includes SiGe alloy, GaAsP alloy, AlInAs alloy, AlGaAs alloy, GaInAs alloy, GaInP alloy and/or GaInAsP alloy, or a combination thereof. The semiconductor layer 124 may be formed by CVD as described previously.

The materials of the source electrode 120S and the drain electrode 120D may include copper, aluminum, molybdenum, tungsten, gold, cobalt, nickel, platinum, titanium, iridium, rhodium, an alloy thereof, a combination thereof, or any other metal material with good conductivity. In other embodiments of the present disclosure, the materials of the source electrode 120S and the drain electrode 120D may be a non-metal materials as long as the non-metal material is conductive. The material of the source electrode 120S and the drain electrode 120D may be formed by CVD, sputtering, resistive thermal evaporation, electron beam evaporation, or any other suitable deposition method as described previously. In some embodiments of the present disclosure, the materials of the source electrode 120S and the drain electrode 120D may be the same, and may be formed by the same deposition steps. However, in other embodiments of the present disclosure, the source electrode 120S and the drain electrode 120D may be formed by different deposition steps, and the materials of the source electrode 120S and the drain electrode 120D may be different from each other.

Next, still referring to FIG. 1A, an insulating layer 126 is formed over the insulating layer 118, and the insulating layer 126 covers the transistor 120 and the gate dielectric layer 122. The insulating layer 126 may be silicon dioxide, silicon nitride, silicon oxynitride, or any other suitable material. The insulating layer 126 may be formed by CVD or spin-on coating as described previously.

Next, still referring to FIG. 1A, a light-emitting angle changing layer 128 is formed over the insulating layer 126. In some embodiments of the present disclosure, as shown in FIG. 1A, the light-emitting angle changing layer 128 is a shielding layer 128 (also referred to as a light-shielding layer 128) for shielding light, and the shielding layer 128 is disposed over the first light-emitting diode element 102. In an embodiment of the present disclosure, the shielding layer 128 may be a metal material, a resin material, or any other suitable light-shielding material. The metal material may include chromium, aluminum, molybdenum, copper, tungsten, gold, nickel, platinum, titanium, iridium, rhodium, an alloy thereof, a combination thereof, or any other metal material for shielding light. The metal material may be formed by CVD, sputtering, resistive thermal evaporation, electron beam evaporation, or any other suitable method as described previously. The resin material is, for example, polyimide resin, epoxy resin, polyester resin, or any other suitable resin material. In some embodiments of the present disclosure, the resin material may be an insulating resin material. The resin material may be formed by the previously described CVD or spin-on coating.

In addition, as shown in FIG. 1A, the shielding layer 128 has a first opening 130A, and the first opening 130A is disposed aligning to the first light-emitting path 116 of the first light-emitting diode element 102. Since the first opening 130A of the shielding layer 128 is disposed aligning to the first light-emitting path 116 of the first light-emitting diode element 102, the first opening 130A can be used to control the light-emitting angle of the light being emitted from the first light-emitting diode element 102. Therefore, the light being emitted from the first light-emitting diode element 102 has a first light-emitting angle $\theta 1$, as shown in FIG. 1A.

In addition, as shown in FIG. 1A, in some embodiments of the present disclosure, the shielding layer 128 may have another opening 132, and the opening 132 is disposed aligning to a subsequent formed via 140. In some embodiments of the present disclosure, the first opening 130A and the opening 132 may be formed by performing a photolithography process and the etching process on the shielding layer 128.

Next, still referring to FIG. 1A, at least one second light-emitting diode element 134 is placed over the shielding layer 128. In some embodiments of the present disclosure, the second light-emitting diode element 134 may be firstly formed over another sapphire substrate, and then the second light-emitting diode element 134 is placed over the shielding layer 128.

It should be appreciated that, although the terms first, second etc. may be used herein to describe various elements, components, regions, layers, and/or portions, these elements, components, regions, layers, portions and/or sections should not be limited by these terms. These terms are only used to distinguish different elements, components, regions, layers, and/or portions. Thus, a first element, component, region, layer, and/or portion discussed below could be termed a second element, component, region, layer, portion or section without departing from the teachings of some embodiments of the present disclosure.

In addition, as shown in FIG. 1A, the second light-emitting diode element 134 is disposed over the substrate 100, and is located at a position other than the region corresponding to the first opening 130A of the shielding layer 128. Alternatively, the second light-emitting diode element 134 is located at a position other than the region corresponding to the first light-emitting path 116 of the first light-emitting diode element 102. In addition, as shown in FIG. 1A, the second light-emitting diode element 134 includes a first semiconductor layer 104B, an active layer 106B, a second semiconductor layer 108B, a lower electrode 110B and an upper electrode 114B which is formed in the subsequent steps. Since all of the structure, material of each layer and the fabricating method of the second light-emitting diode element 134 are the same as or similar to those of the first light-emitting diode element 102 mentioned above, this section will not be repeated.

In addition, in some embodiments of the present disclosure, the lower electrode 110B of the second light-emitting diode element 134 is coupled (or electrically connected) to a second common voltage Vcom2. In other words, the first semiconductor layer 104B of the second light-emitting diode element 134 is coupled to the second common voltage Vcom2. This section will be described in detail in FIG. 1B.

As shown in FIG. 1A, in some embodiments of present disclosure, the second light-emitting diode element 134 can emit light by applying a voltage to the lower electrode 110B and/or the upper electrode 114B of the second light-emitting diode element 134. In addition, as shown in FIG. 1A, the light being emitted from the second light-emitting diode element 134 has a second light-emitting path 136. In addition, the light being emitted from the second light-emitting diode element 134 has a second light-emitting angle $\theta 2$, and the second light-emitting angle $\theta 2$ is greater than the first light-emitting angle $\theta 1$ of the first light-emitting diode element 102.

In some embodiments of the present disclosure, the second light-emitting angle $\theta 2$ of the second light-emitting diode element 134 is between about 160° and about 180°, such as between about 170° and about 178°. The first light-emitting angle $\theta 1$ of the first light-emitting diode element 102 is between about 30° and about 90°, such as between about 45° and about 60°. However, it should be note that the first light-emitting angle $\theta 1$ and the second light-emitting angle $\theta 2$ of the present disclosure are not limited to the aforementioned ranges. In some other embodiments of the present disclosure, the first light-emitting angle $\theta 1$ and the second light-emitting angle $\theta 2$ may be any other suitable light-emitting angle.

The terms "about" and "substantially" typically mean +/−20% of the stated value, such as +/−10% of the stated value, and such as +/−5%, or +/−3%, or +/−2%, or +/−1%, or +/−0.5% of the stated value. The stated value of the present disclosure is an approximate value. When there is no specific description, the stated value includes the meaning of "about" or "substantially".

Referring to FIG. 1A, the embodiments of the present disclosure give the display devices of the present disclosure the ability of switching between wide and narrow viewing angles by disposing two light-emitting diode elements having different light-emitting angles in display devices, and thereby the embodiments of the present disclosure can significantly increase the number of applications of the display devices.

For example, in some embodiments of the present disclosure, when the display device is in a narrow viewing angle mode, the first light-emitting diode element and the second light-emitting diode element in the display device may be controlled to make the first light-emitting diode element with a smaller light-emitting angle emit light, and the second light-emitting diode element with a larger light-emitting angle does not emit light, thereby narrowing the viewing angle of the display device.

In addition, when the display device is in a wide viewing angle mode, the first light-emitting diode element and the second light-emitting diode element in the display device may be controlled to make the second light-emitting diode element with a larger light-emitting angle emit light, and the first light-emitting diode element with a smaller light-emitting angle does not emit light, thereby increasing the viewing angle of the display device.

Alternatively, in some embodiments of the present disclosure, when the display device is in a wide viewing angle mode, the first light-emitting diode element and the second light-emitting diode element in the display device may be controlled to make both the first light-emitting diode element and the second light-emitting diode element emit light, thereby increasing the light-emitting brightness of the display device in the wide viewing angle mode.

In addition, as shown in FIG. 1A, in some embodiments of the present disclosure, the first light-emitting diode element is disposed over the substrate, and the second light-emitting diode element is disposed over the upper insulating layer (or disposed over the shielding layer). Therefore, the two light-emitting diode elements are disposed at two different layers. The embodiments of the present disclosure make the display device further have function of displaying 3D image by disposing the two light-emitting diode elements at two different layers respectively in the display device. Therefore, the embodiments of the present disclosure can further increase the applicability of the display device.

Next, still referring to FIG. 1A, an insulating layer 138 is formed over the insulating layer 126 and the shielding layer 128, and the insulating layer 138 surrounds the second light-emitting diode element 134. In some embodiments of the present disclosure, the insulating layer 138 may be silicon dioxide, silicon nitride, silicon oxynitride, or any other suitable material. The insulating layer 138 may be formed by CVD or spin-on coating as described previously.

Next, still referring to FIG. 1A, a via 140 is formed. The via 140 penetrates through the insulating layer 138, insulating layer 126, gate dielectric layer 122 and the insulating layer 118, and is connected to the upper electrode 114A of the first light-emitting diode element 102 and the drain electrode 120D of the transistor 120. In addition, the via 140 penetrates through the opening 132 of the shielding layer 128 and is not in contact with the shielding layer 128. In some embodiments of the present disclosure, the material of the via 140 includes copper, aluminum, molybdenum, tungsten, gold, chromium, nickel, platinum, titanium, iridium, rhodium, an alloy thereof, a combination thereof, or any other metal material with good conductivity.

Next, still referring to FIG. 1A, an upper electrode 114B of the second light-emitting diode element 134 is formed over the insulating layer 138 and the second semiconductor layer 108B. The upper electrode 114B is electrically connected to the second semiconductor layer 108B, and the upper electrode 114B may be disposed at any position where the upper electrode 114B is electrically connected to the second semiconductor layer 108B. In addition, the upper electrode 114B is also electrically connected to the via 140. Therefore, as shown in FIG. 1A, the drain electrode 120D of the transistor 120 is electrically connected to the upper electrode 114B (or the second semiconductor layer 108B) of the second light-emitting diode element 134 and the upper electrode 114A (or the second semiconductor layer 108A) of the first light-emitting diode element 102 through the via 140.

In some embodiments of the present disclosure, the material of the upper electrode 114B includes copper, aluminum, molybdenum, tungsten, gold, chromium, nickel, platinum, titanium, iridium, rhodium, an alloy thereof, a combination thereof, or any other metal material with good conductivity.

In some embodiments of the present disclosure, the via 140 and the upper electrode 114B may be formed in the following steps. First, an opening (not shown) is formed by a photolithography process and the etching process. The opening penetrates through the insulating layer 138, the insulating layer 126, the gate dielectric layer 122 and the insulating layer 118, and exposes the upper electrode 114A of the first light-emitting diode element 102 and the drain electrode 120D of the transistor 120. In addition, the opening penetrates through the opening 132 of the shielding layer 128, and is not in contact with the shielding layer 128.

Next, a deposition process is performed to form a metal layer (not shown). The metal layer covers the insulating layer 138 and the second semiconductor layer 108B of the second light-emitting diode element 134, and the metal layer fills into the aforementioned opening. The material of the metal layer includes copper, aluminum, molybdenum, tungsten, gold, chromium, nickel, platinum, titanium, iridium, rhodium, an alloy thereof, a combination thereof, or any other metal material with good conductivity. The deposition process may include the previously described CVD, sputtering, resistive thermal evaporation, electron beam evaporation, or any other suitable deposition method.

Next, a photolithography process and an etching process are performed to remove a portion of the metal layer over the insulating layer 138 and the second semiconductor layer 108B. The portion of the metal layer remained on the insulating layer 138 and the second semiconductor layer 108B is formed as the upper electrode 114B, and the portion of the metal layer that remains in the opening is formed as the via 140. Therefore, in some embodiments of the present disclosure, the materials of the via 140 and the upper electrode 114B may be the same and may be formed in the same deposition step.

However, the embodiments of the present disclosure are not limited to this. In other embodiments, the via 140 and the upper electrode 114B may be formed by different deposition processes, and the materials of the via 140 and the upper electrode 114B may be different from each other.

Next, still referring to FIG. 1A, an insulating layer 142 is formed over the insulating layer 138 to form the display device 1000A. The insulating layer 142 covers the second light-emitting diode element 134. The insulating layer 142 may be silicon dioxide, silicon nitride, silicon oxynitride, or any other suitable material. The insulating layer 142 may be formed by CVD or spin-on coating as described previously.

Referring to FIG. 1A, the embodiments of the present disclosure provide a display device 1000A. The display device 1000A includes a substrate 100, at least one first light-emitting diode element 102 disposed over the substrate 100, and an insulating layer 112 disposed over the substrate 100 and surrounding the first light-emitting diode element 102. The display device 1000A further includes an insulating layer 118 disposed over the insulating layer 112, a transistor 120 disposed over the insulating layer 118, an insulating layer 126 disposed over the insulating layer 118 and covering the transistor 120 and the gate dielectric layer 122, and a shielding layer 128 disposed over the insulating layer 126.

The display device 1000A further includes at least one second light-emitting diode element 134 disposed over the shielding layer 128. The second light-emitting diode element 134 is disposed at a position other than the region corresponding to the first opening 130A of the shielding layer 128. The display device 1000A further includes an insulating layer 138 disposed over the insulating layer 126 and the shielding layer 128 and surrounding the second light-emitting diode element 134, and an insulating layer 142 disposed over the insulating layer 138 and covering the second light-emitting diode element 134.

In some embodiments of the present disclosure, relative terms such as "lower", "upper", "horizontal", "vertical", "below", "above", "top", "bottom", etc. should be construed to refer to the orientation as described in the paragraph or as shown in the drawing. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

As shown in FIG. 1A, the drain electrode 120D of the transistor 120 is coupled to the upper electrode 114A (or the second semiconductor layer 108A) of the first light-emitting diode element 102 and the upper electrode 114B (or the second semiconductor layer 108B) of the second light-emitting diode element 134 through the via 140. In addition, in some embodiments of the present disclosure, the lower electrode 110A (or the first semiconductor layer 104A) of the first light-emitting diode element 102 is coupled to the first common voltage Vcom1. The lower electrode 110B (or the first semiconductor layer 104B) of the second light-emitting diode element 134 is coupled to the second common voltage Vcom2.

Figure 1B:
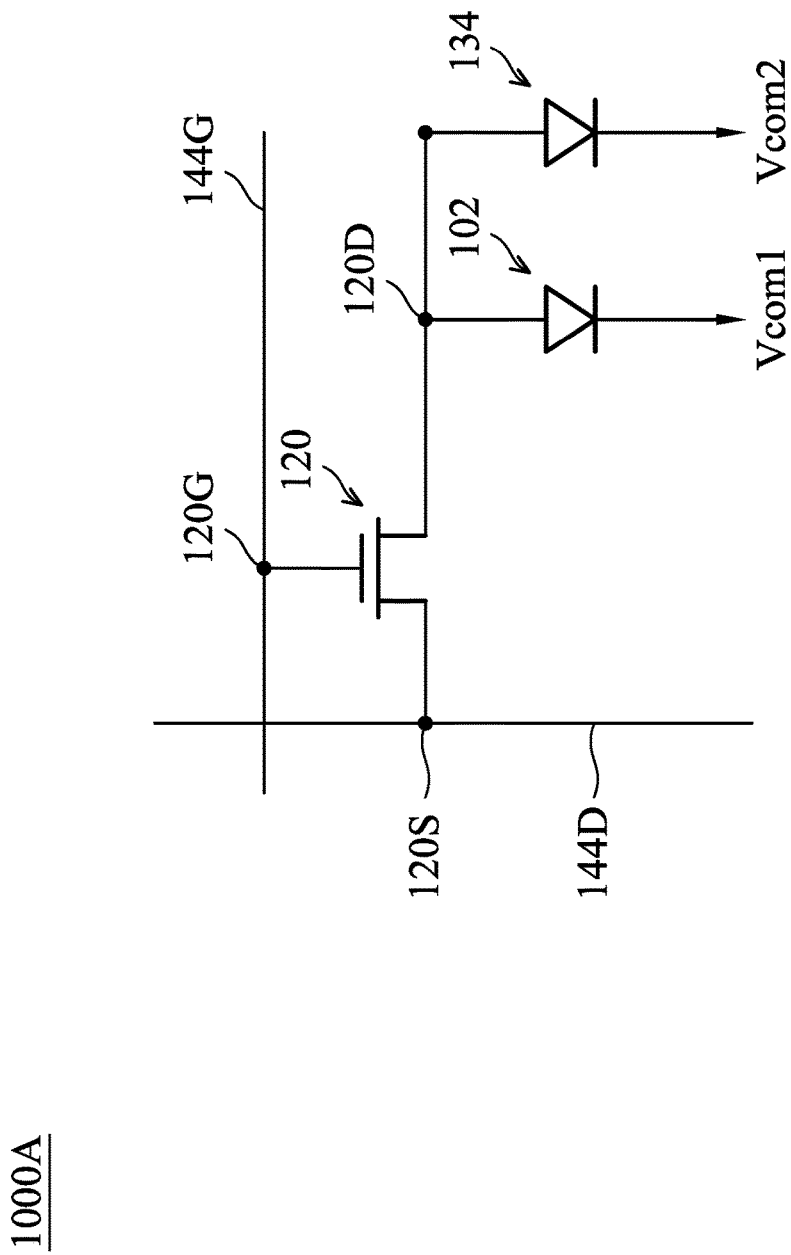
FIG. 1B is an equivalent circuit diagram of a display device in accordance with some embodiments of the present disclosure.

FIG. 1B is an equivalent circuit diagram of the display device 1000A in accordance with some embodiments of the present disclosure. As shown in FIG. 1B, the display device 1000A includes at least one gate line 144G and at least one data line 144D. The gate line 144G and the data line 144D are disposed over the substrate 100 (not shown in FIG. 1B). The gate electrode 120G of the transistor 120 is coupled to the gate line 144G, and the source electrode 120S of the transistor 120 is coupled to the data line 144D. In addition, the drain electrode 120D of the transistor 120 is coupled to one end of the first light-emitting diode element 102 and one end of the second light-emitting diode element 134 at the same time. The end of the first light-emitting diode element 102 is, for example, the upper electrode 114A or the second semiconductor layer 108A of the first light-emitting diode element 102, and the end of the second light-emitting diode element 134 is, for example, the upper electrode 114B or the second semiconductor layer 108B of the second light-emitting diode element 134.

In addition, another end (such as the lower electrode 110A or the first semiconductor layer 104A) of the first light-emitting diode element 102 is coupled to the first common voltage Vcom1, and another end (such as the lower electrode 110B or the first semiconductor layer 104B) of the second light-emitting diode element 134 is coupled to the second common voltage Vcom2.

In some embodiments of the present disclosure, the first light-emitting diode element 102 and the second light-emitting diode element 134 can be independently controlled to emit light or not by controlling the first common voltage Vcom1 and the second common voltage Vcom2.

Figure 1C:
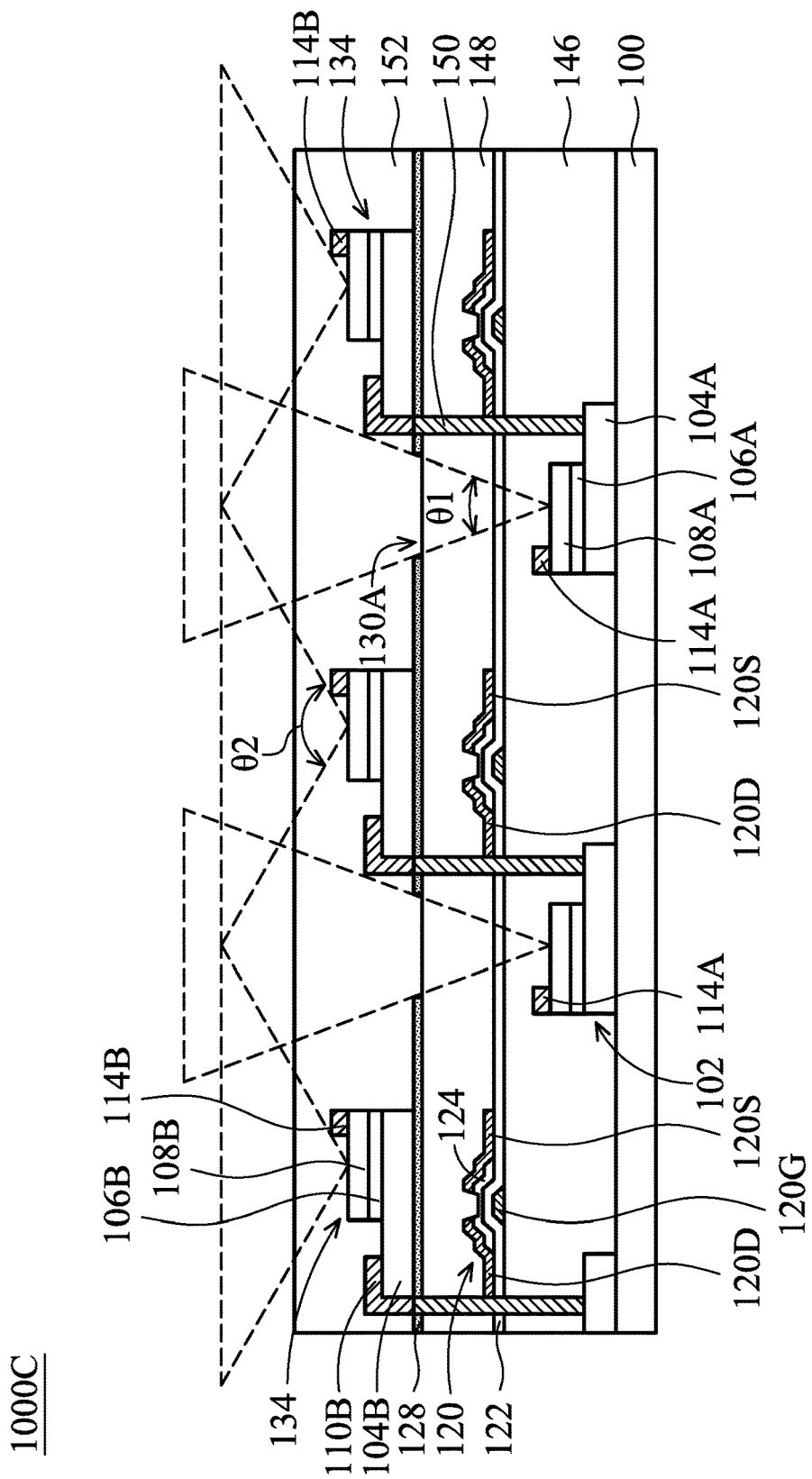
FIG. 1C is a cross-sectional view of a display device in accordance with some other embodiments of the present disclosure.

It should be noted that the exemplary embodiment set forth in FIG. 1A is merely for the purpose of illustration, and the scope of the embodiments of the present disclosure is not limited to this. In addition to the embodiments set forth in FIG. 1A, the display devices of some embodiments of the present disclosure have other configurations, for example as shown in FIG. 1C. This will be described in detail in the following description. Therefore, the scope of the present disclosure is not limited to the exemplary embodiments shown in FIG. 1A.

It should be noted that the subsequently described elements or layers that are the same as or similar to those previously described will be denoted by the same or similar reference numerals, and the materials, fabricating methods and functions of the subsequently described elements or layers are the same as or similar to those previously described, and therefore, those will not be repeated in the following description.

In addition, the materials, fabricating methods and functions of the subsequently described substrates, insulating layers, vias and shielding layers are the same as or similar to those previously described, and the structure, materials of each layer, fabricating methods and functions of the subsequently described light-emitting diode elements and transistors are the same as or similar to those previously described. Therefore, those will not be repeated in the following description.

FIG. 1C is a cross-sectional view of a display device 1000C in accordance with some other embodiments of the present disclosure. As shown in FIG. 1C, the display device 1000C includes a substrate 100, at least one first light-emitting diode element 102 disposed over the substrate 100, and an insulating layer 146 disposed over the substrate 100 and covering the first light-emitting diode element 102. The display device 1000C further includes a transistor 120 disposed over the insulating layer 146, an insulating layer 148 disposed over the insulating layer 146 and covering the transistor 120 and a gate dielectric layer 122, and a shielding layer 128 disposed over the insulating layer 148.

The display device 1000C further includes a via 150 penetrating through the shielding layer 128, the insulating layer 148, the gate dielectric 122, and insulating layer 146. The via 150 is connected to a first semiconductor layer 140A of the first light-emitting diode element 102 and a drain electrode 120D of the transistor 120. The display device 1000C further includes at least one second light-emitting diode element 134 disposed over the shielding layer 128. The second light-emitting diode element 134 is disposed at a position other than the region corresponding to a first opening 130A of the shielding layer 128. The display device 1000C further includes an insulating layer 152 disposed over the insulating layer 148 and the shielding layer 128 and covering the second light-emitting diode element 134.

In some embodiments of the present disclosure, in shown in FIG. 1C, a lower electrode 110B of the second light-emitting diode element 134 further extends to the sidewall of the first semiconductor layer 104B and is electrically connected to the via 150. The drain electrode 120D of the transistor 120 is coupled to the first semiconductor layer 104A of the first light-emitting diode element 102 and the lower electrode 110B (or the first semiconductor layer 104B) of the second light-emitting diode element 134.

In addition, in some embodiments of the present disclosure, an upper electrode 114A (or a second semiconductor layer 108A) of the first light-emitting diode element 102 is coupled to a first common voltage Vcom1. An upper electrode 114B (or a second semiconductor layer 108B) of the second light-emitting diode element 134 is coupled to a second common voltage Vcom2.

In addition, as shown in FIG. 1C, the lower electrode (such as the lower electrode 110A as shown in FIG. 1A) of the first light-emitting diode element 102 may not be formed independently. In this embodiment, the via 150 as shown in FIG. 1C may also be regarded as the lower electrode of the first light-emitting diode element 102.

However, the embodiments of the present disclosure are not limited to this. In some other embodiments of the present disclosure, the lower electrode (such as the lower electrode 110A as shown in FIG. 1A) of the first light-emitting diode element 102 may be formed independently in the display device 1000C.

In addition, as shown in FIG. 1C, the shielding layer 128 may be in direct contact with the via 150 in the display device 1000C. In some embodiments of the present disclosure, if the material of the shielding layer 128 is a metal material, then the shielding layer 128 is electrically connected to the via 150.

Figure 2A:
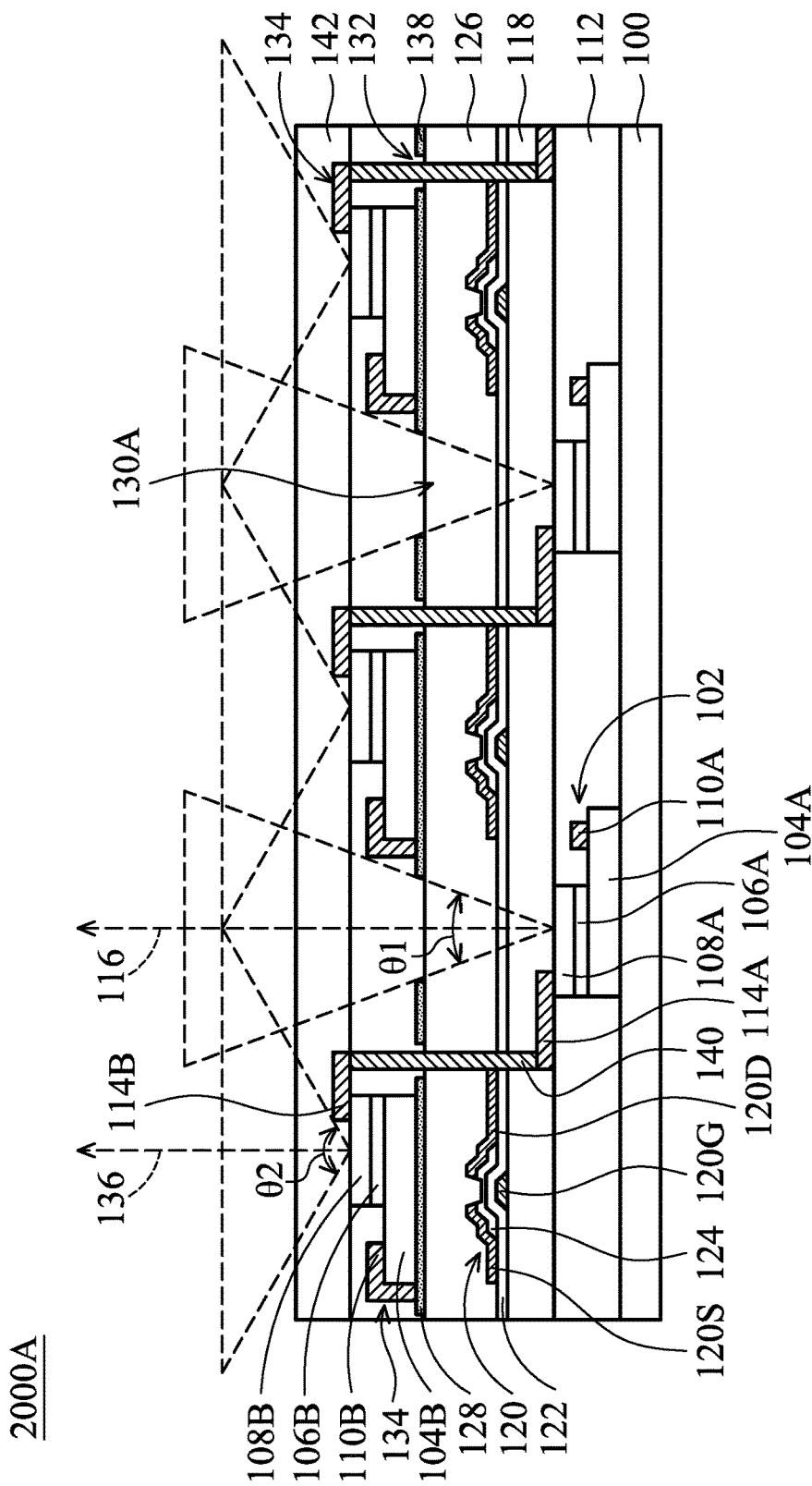
FIG. 2A is a cross-sectional view of a display device in accordance with some other embodiments of the present disclosure.
Figure 2B:
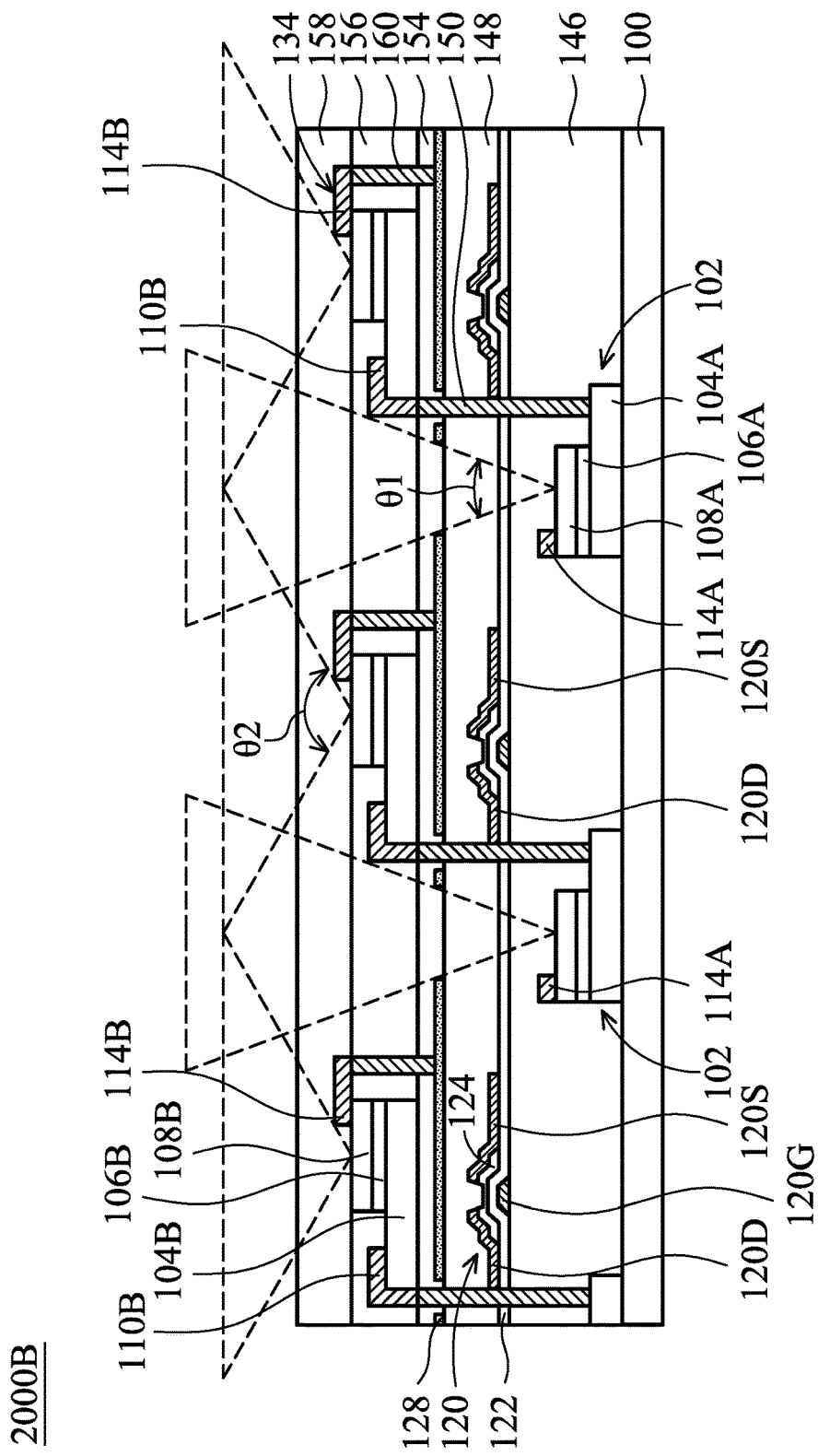
FIG. 2B is a cross-sectional view of a display device in accordance with some other embodiments of the present disclosure.
Figure 2C:
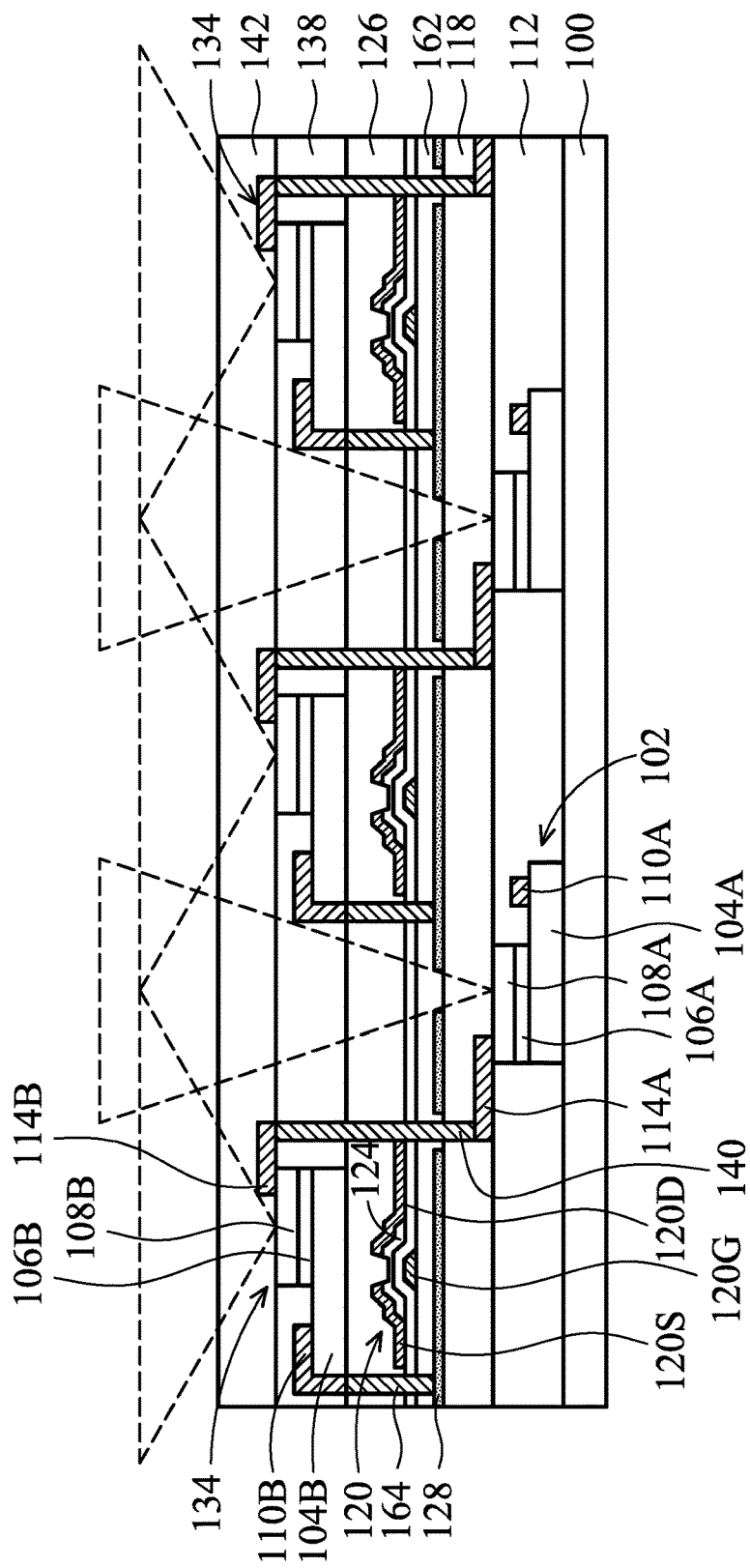
FIG. 2C is a cross-sectional view of a display device in accordance with some other embodiments of the present disclosure.

It should be noted that the exemplary embodiments set forth in FIGS. 1A-1C are merely for the purpose of illustration, and the scope of the embodiments of the present disclosure is not limited to this. In addition to the embodiments set forth in FIGS. 1A-1C, the display devices of the present disclosure have other configurations as shown in FIGS. 2A-2C. This will be described in detail in the following description. Therefore, the scope of the present disclosure is not limited to the exemplary embodiments shown in FIGS. 1A-1C.

FIG. 2A is a cross-sectional view of a display device 2000A in accordance with some other embodiments of the present disclosure. The difference between the embodiments shown in FIGS. 1A and 2A is that the lower electrode 110B of the second light-emitting diode element 134 of FIG. 2A further extends to the sidewall of the first semiconductor layer 104B and is in contact with the shielding layer 128. In some embodiments of the present disclosure, if the material of the shielding layer 128 is a metal material, then the lower electrode 110B of the second light-emitting diode element 134 is electrically connected to the shielding layer 128. In other words, the lower electrode 110B and the shielding layer 128 are both coupled to the second common voltage Vcom2.

FIG. 2B is a cross-sectional view of a display device 2000B in accordance with some other embodiments of the present disclosure. The difference between the embodiments shown in FIGS. 2B and 1C is that the display device 2000B includes an insulating layer 154 disposed over the insulating layer 148 and the shielding layer 128. The second light-emitting diode element 134 is disposed over the insulating layer 154 and is not in contact with the shielding layer 128. Next, the display device 2000B further includes an insulating layer 156 disposed over the insulating layer 154 and surrounding the second light-emitting diode element 134, and an insulating layer 158 disposed over the insulating 156 and covering the second light-emitting diode element 134. In addition, the display device 2000B further includes a via 160 penetrating through the insulating layer 156 and the insulating layer 154. The via 160 is connected to an upper electrode 114B of the second light-emitting diode element 134 and the shielding layer 128. In addition, the shielding layer 128 is not in contact with the via 150.

In some embodiments of the present disclosure, if the material of the shielding layer 128 is a metal material, then the upper electrode 114B of the second light-emitting diode element 134 is electrically connected to the shielding layer 128. In other words, the upper electrode 114B and the shielding layer 128 are both coupled to the second common voltage Vcom2.

FIG. 2C is a cross-sectional view of a display device 2000C in accordance with some other embodiments of the present disclosure. The difference between the embodiments shown in FIGS. 2C and 2A is that the shielding layer 128 of FIG. 2C is disposed under the transistor 120 instead of over the transistor 120.

In detail, the display device 2000C further includes an insulating layer 162 between the transistor 120 and the insulating layer 118, and the shielding layer 128 is disposed between the insulating layer 162 and the insulating layer 118. In other words, the shielding layer 128 is disposed over insulating layer 118 and is covered by the insulating layer 162.

In addition, the display device 2000C further includes a via 164 penetrating through the insulating layer 126, the gate dielectric layer 122, and the insulating layer 162. The via 164 is connected to the shielding layer 128. In addition, the shielding layer 128 is not in contact with the source electrode 120S of the transistor 120. In some embodiments of the present disclosure, if the material of the shielding layer 128 is a metal material, then the lower electrode 110B of the second light-emitting diode element 134 is electrically connected to the shielding layer 128 through the via 164. In other words, the lower electrode 110B and the shielding layer 128 are both coupled to the second common voltage Vcom2.

Figure 3A:
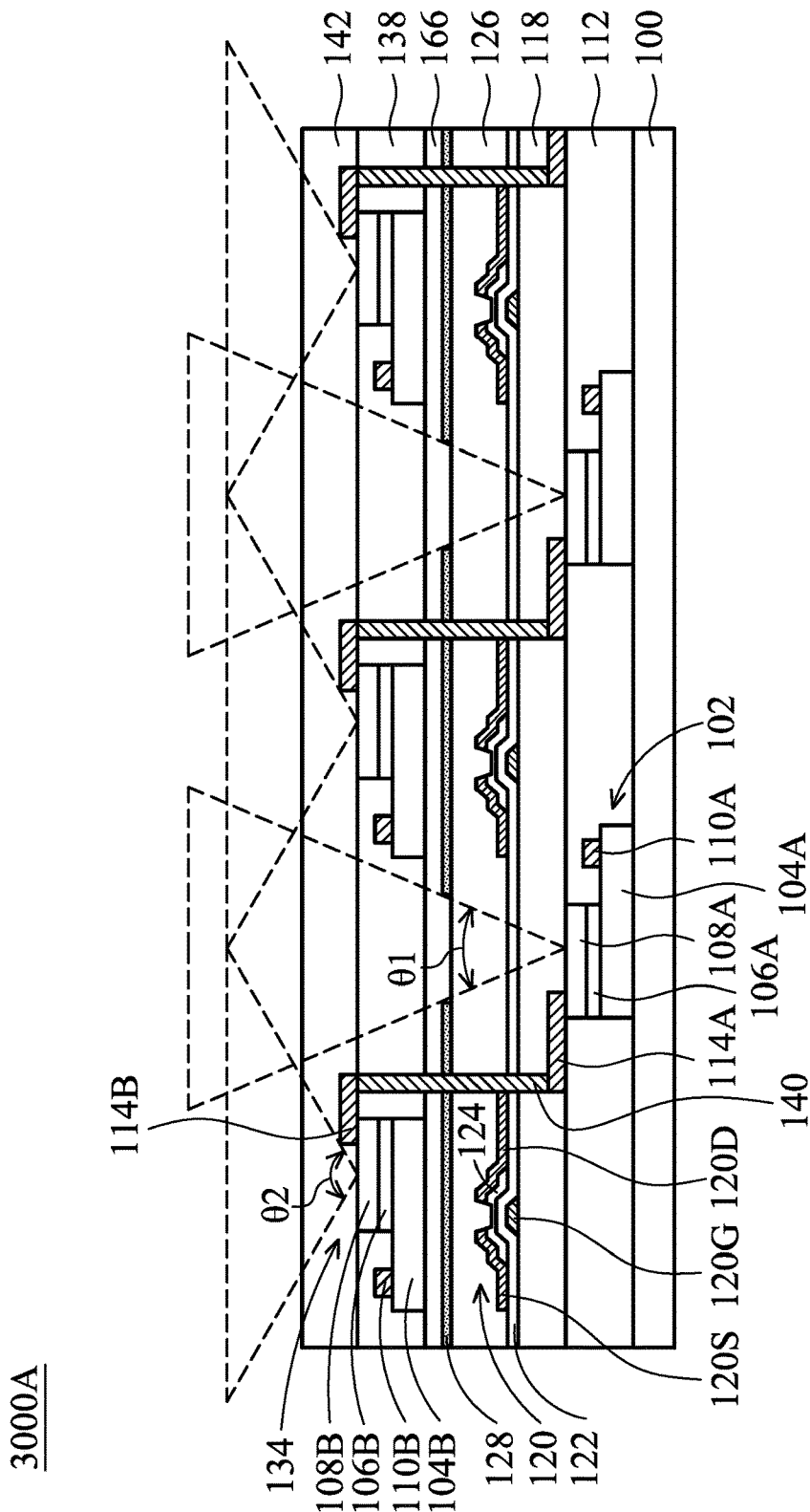
FIG. 3A is a cross-sectional view of a display device in accordance with some other embodiments of the present disclosure.
Figure 3B:
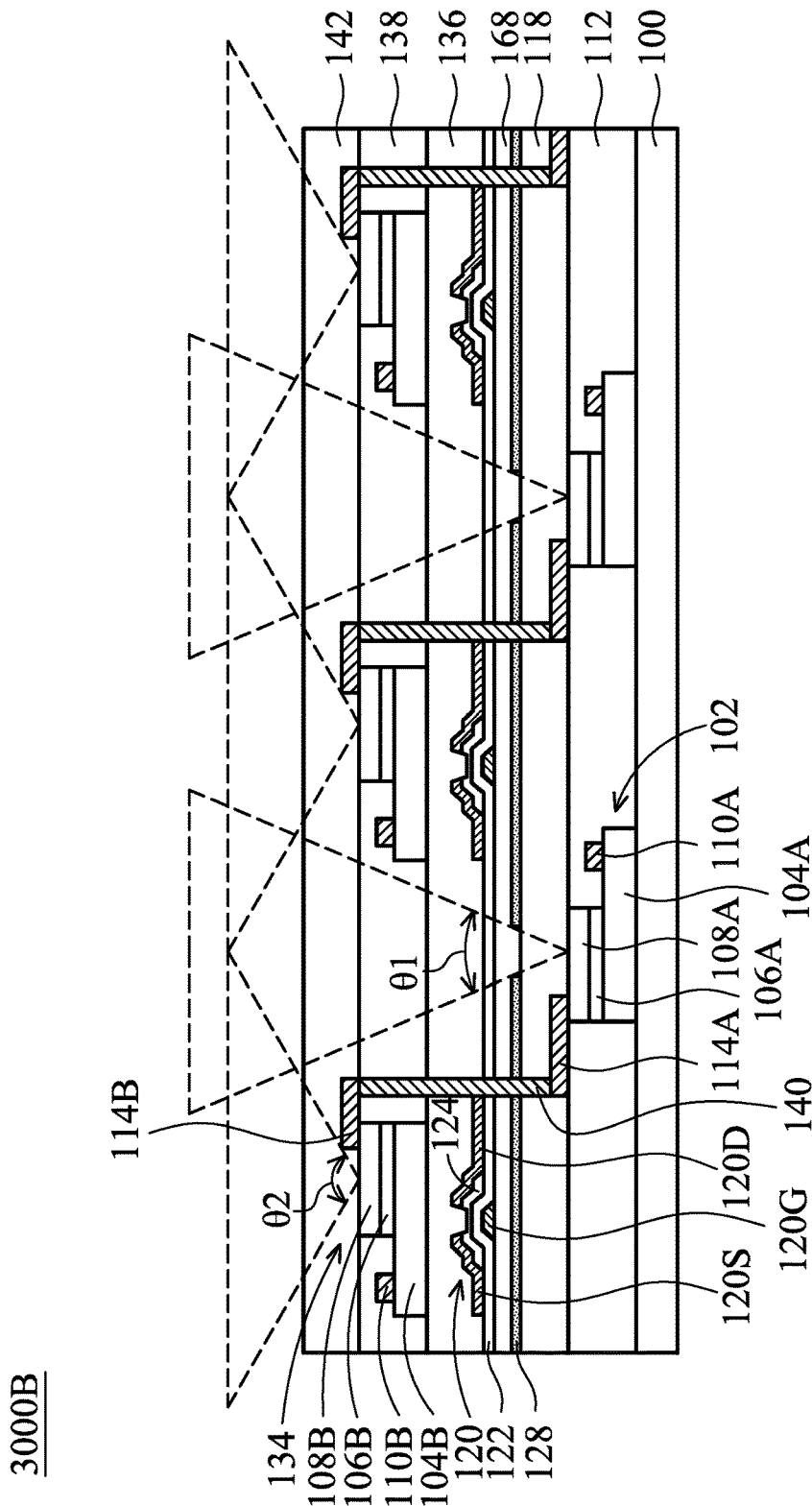
FIG. 3B is a cross-sectional view of a display device in accordance with some other embodiments of the present disclosure.

It should be noted that the exemplary embodiments set forth in FIGS. 1A-2C are merely for the purpose of illustration, and the scope of the embodiments of the present disclosure is not limited to this. In addition to the embodiments set forth in FIGS. 1A-2C, the display devices of the present disclosure have other configurations as shown in FIGS. 3A-3B. This will be described in detail in the following description. Therefore, the scope of the present disclosure is not limited to the exemplary embodiments shown in FIGS. 1A-2C.

FIG. 3A is a cross-sectional view of a display device 3000A in accordance with some other embodiments of the present disclosure. The difference between the embodiments shown in FIGS. 3A and 1A is that the display device 3000A includes an insulating layer 166 disposed over the insulating layer 126 and the shielding layer 128. The second light-emitting diode element 134 is disposed over the insulating layer 166 and is not in contact with the shielding layer 128. In addition, the shielding layer 128 is in direct contact with the via 140. In some embodiments of the present disclosure, if the material of the shielding layer 128 is a metal material, then the shielding layer 128 is electrically connected to the drain electrode 120D of the transistor 120 through the via 140.

FIG. 3B is a cross-sectional view of a display device 3000B in accordance with some other embodiments of the present disclosure. The difference between the embodiments shown in FIGS. 3B and 1A is that the shielding layer 128 of FIG. 3B is disposed below the transistor 120 instead of over the transistor 120.

In detail, the display device 3000B further includes an insulating layer 168 disposed between the transistor 120 and the insulating layer 118, and the shielding layer 128 is disposed between the insulating layer 168 and the insulating layer 118. In other words, the shielding layer 128 is disposed over the insulating layer 118 and is covered by the insulating layer 168. In addition, the shielding layer 128 is in direct contact with the via 140. In some embodiments of the present disclosure, if the material of the shielding layer 128 is a metal material, then the shielding layer 128 is electrically connected to the drain electrode 120D of the transistor 120 through the via 140.

Figure 4:
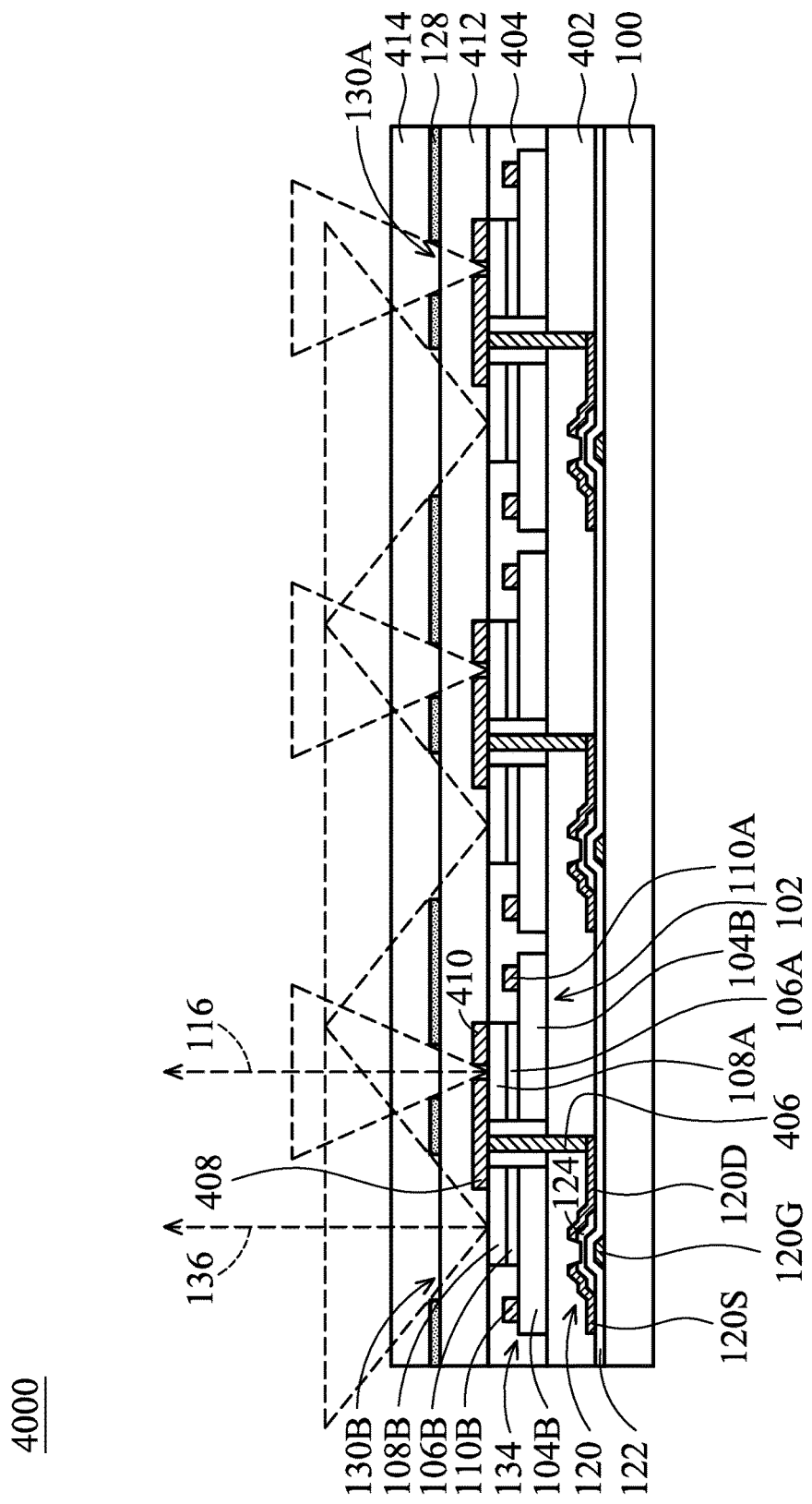
FIG. 4 is a cross-sectional view of a display device in accordance with some other embodiments of the present disclosure.

It should be noted that the exemplary embodiments set forth in FIGS. 1A-3B are merely for the purpose of illustration, and the scope of the embodiments of the present disclosure is not limited to this. In addition to the embodiments set forth in FIGS. 1A-3B, the display devices of the present disclosure have other configurations as shown in FIG. 4. This will be described in detail in the following description. Therefore, the scope of the present disclosure is not limited to the exemplary embodiments shown in FIGS. 1A-3B.

FIG. 4 is a cross-sectional view of a display device 4000 in accordance with some other embodiments of the present disclosure. The difference between the embodiments shown in FIGS. 4 and 1A-3B is that the first light-emitting diode element 102 and the second light-emitting diode element 134 of FIG. 4 are disposed on the same layer instead of disposed on two different layers respectively. In detail, the display device 4000 includes a substrate 100, a transistor 120 disposed over the substrate 100, an insulating layer 402 disposed over the substrate 100 and covering the transistor 120 and the gate dielectric layer 122. The display device 4000 further includes a first light-emitting diode element 102 and a second light-emitting diode element 134 disposed over the insulating layer 402, and an insulating layer 404 disposed over the insulating layer 402 and surrounding the first light-emitting diode element 102 and the second light-emitting diode element 134.

As shown in FIG. 4, the display device 4000 further includes a via 406 penetrating through the insulating layer 404 and the insulating layer 402. The via 406 is electrically connected to the second semiconductor layer 108A of the first light-emitting diode element 102 and the second semiconductor layer 108B of the second light-emitting diode element 134 through an electrode 408. As shown in FIG. 4, the electrode 408 may be used as an upper electrode of the first light-emitting diode element 102 and an upper electrode of the second light-emitting diode element 134 at the same time.

In addition, as shown in FIG. 4, in some embodiments of the present disclosure, a light-shielding element 410 may be formed over the second semiconductor layer 108A of the first light-emitting diode element 102. The light-shielding element 410 is used to control the light-emitting angle of the first light-emitting diode element 102.

In some embodiments of the present disclosure, the material of the light-shielding element 410 is metal and may be a portion of the electrode 408. In this embodiment, the light-shielding element 410 is connected to the electrode 408 in a top view. However, the present disclosure is not limited to this. In some other embodiments of the present disclosure, the light-shielding element 410 and the electrode 408 are independently separate metal patterns. In these embodiments, the light-shielding element 410 may not be in contact with the electrode 408.

Next, still referring to FIG. 4, the display device 4000 further includes an insulating layer 412 disposed over the insulating layer 404 and covering the first light-emitting diode element 102 and the second light-emitting diode element 134, and a shielding layer 128 disposed over the insulating layer 412.

As shown in FIG. 4, the shielding layer 128 has a second opening 130B. The second opening 130B is disposed aligning to a second light-emitting path 136 of the second light-emitting diode element 134. Since the second opening 130B of the shielding layer 128 is disposed aligning to the second light-emitting path 136 of the second light-emitting diode element 134, the second opening 130B may be used to control a second light-emitting angle θ2 of the light being emitted from the second light-emitting diode element 134. Next, still referring to FIG. 4, the display device 4000 further includes an insulating layer 414 disposed over the insulating layer 412 and covering the shielding layer 128.

Figure 5A:
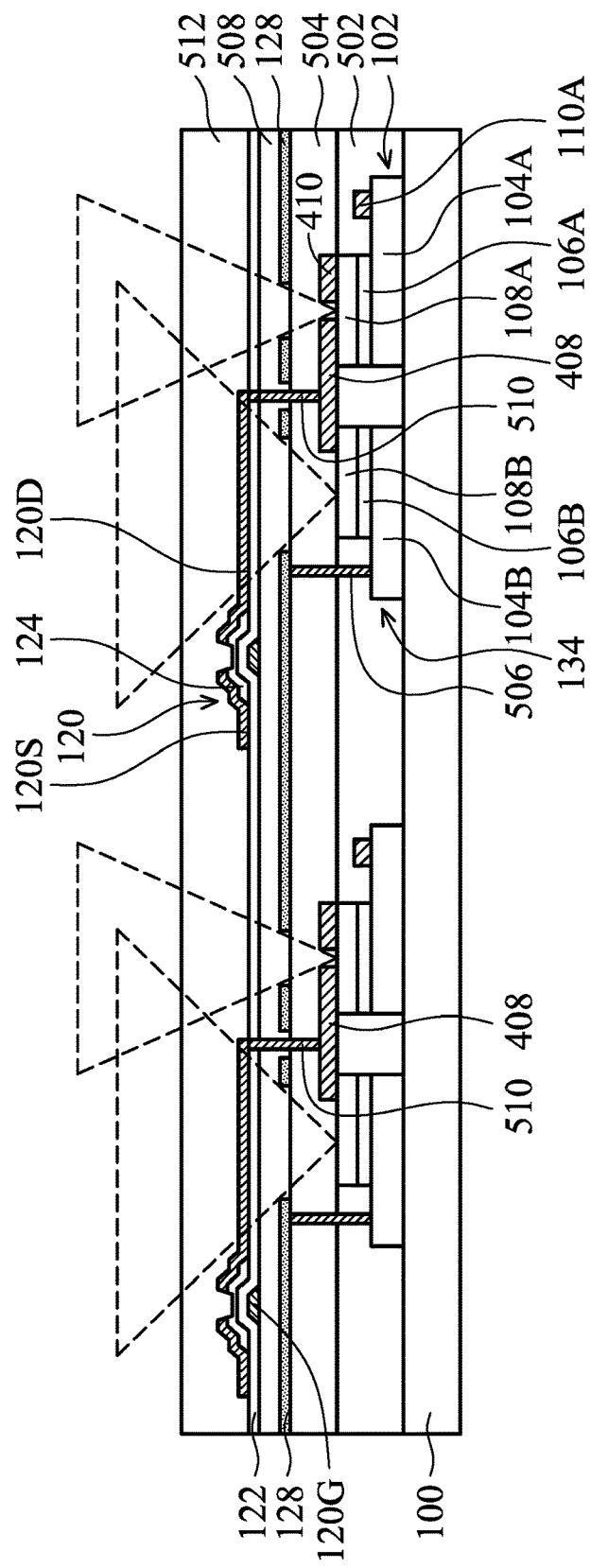
FIG. 5A is a cross-sectional view of a display device in accordance with some other embodiments of the present disclosure.
Figure 5B:
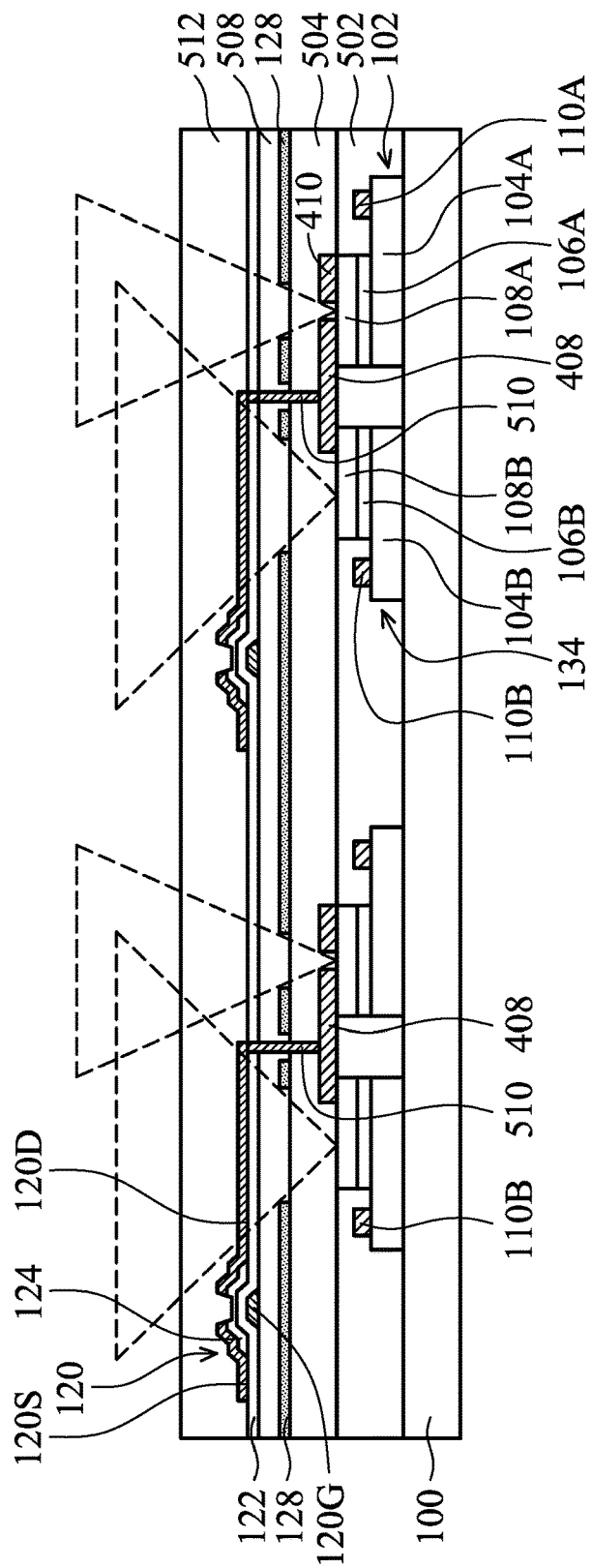
FIG. 5B is a cross-sectional view of a display device in accordance with some other embodiments of the present disclosure.

It should be noted that the exemplary embodiment set forth in FIG. 4 is merely for the purpose of illustration, and the scope of the embodiments of the present disclosure is not limited to this. In addition to the embodiment set forth in FIG. 4, the display devices of the present disclosure have other configurations as shown in FIGS. 5A-5B. This will be described in detail in the following description. Therefore, the scope of the present disclosure is not limited to the exemplary embodiment shown in FIG. 4.

FIG. 5A is a cross-sectional view of a display device 5000A in accordance with some other embodiments of the present disclosure. The difference between the embodiments shown in FIGS. 5 and 4 is that the transistor 120 of FIG. 5A is disposed above the first light-emitting diode element 102 and the second light-emitting diode element 134 instead of below the first light-emitting diode element 102 and the second light-emitting diode element 134.

In detail, as shown in FIG. 5, the display device 5000A includes a first light-emitting diode element 102 and a second light-emitting diode element 134 disposed over the substrate 100, and an insulating layer 502 disposed over the substrate 100 and surrounding the first light-emitting diode element 102 and the second light-emitting diode element 134. The display device 5000A further includes an insulating layer 504 disposed over the insulating layer 502, and a shielding layer disposed over the insulating layer 504.

The display device 5000A further includes a via 506 penetrating through the insulating layer 504 and the insulating layer 502. The via 506 is connected to the first semiconductor layer 104B of the second light-emitting diode element 134 and the shielding layer 128. In some embodiments of the present disclosure, if the material of the shielding layer 128 is a metal material, then the shielding layer 128 is electrically connected to the first semiconductor layer 104B of the second light-emitting diode element 134 through the via 506. In some embodiments of the present disclosure, the first semiconductor layer 104B of the second light-emitting diode element 134, the via 506, and the shielding layer 128 are all coupled to the second common voltage Vcom2.

In addition, as shown in FIG. 5A, a lower electrode (such as the lower electrode 110B as shown in FIG. 1A) of the second light-emitting diode element 134 may be not formed independently. In this embodiment, via 506 as shown in FIG. 5A may also be regarded as the lower electrode of the second light-emitting diode element 134.

Next, still referring to FIG. 5A, the display device 5000A further includes an insulating layer 508 disposed over the insulating layer 504 and covering the shielding layer 128, and a transistor 120 disposed over the insulating layer 508. The drain electrode 120D of the transistor 120 is electrically connected to the second semiconductor layer 108A of the first light-emitting diode element 102 and the second semiconductor layer 108B of the second light-emitting diode element 134 through another via 510 and an electrode 408. As shown in FIG. 4, the electrode 408 may be used as the upper electrode of the first light-emitting diode element 102 and an upper electrode of the second light-emitting diode element 134. Still referring to FIG. 5A, the display device 5000A further includes an insulating layer 512 disposed over the insulating layer 508 and covering the transistor 120.

FIG. 5B is a cross-sectional view of a display device 5000B in accordance with some other embodiments of the present disclosure. The difference between the embodiments shown in FIGS. 5B and 5A is that the display device 5000B includes a lower electrode 110B of the second light-emitting diode element 134, which is independently formed, and the lower electrode 110B is not in contact with the shielding layer 128.

Figure 6A:
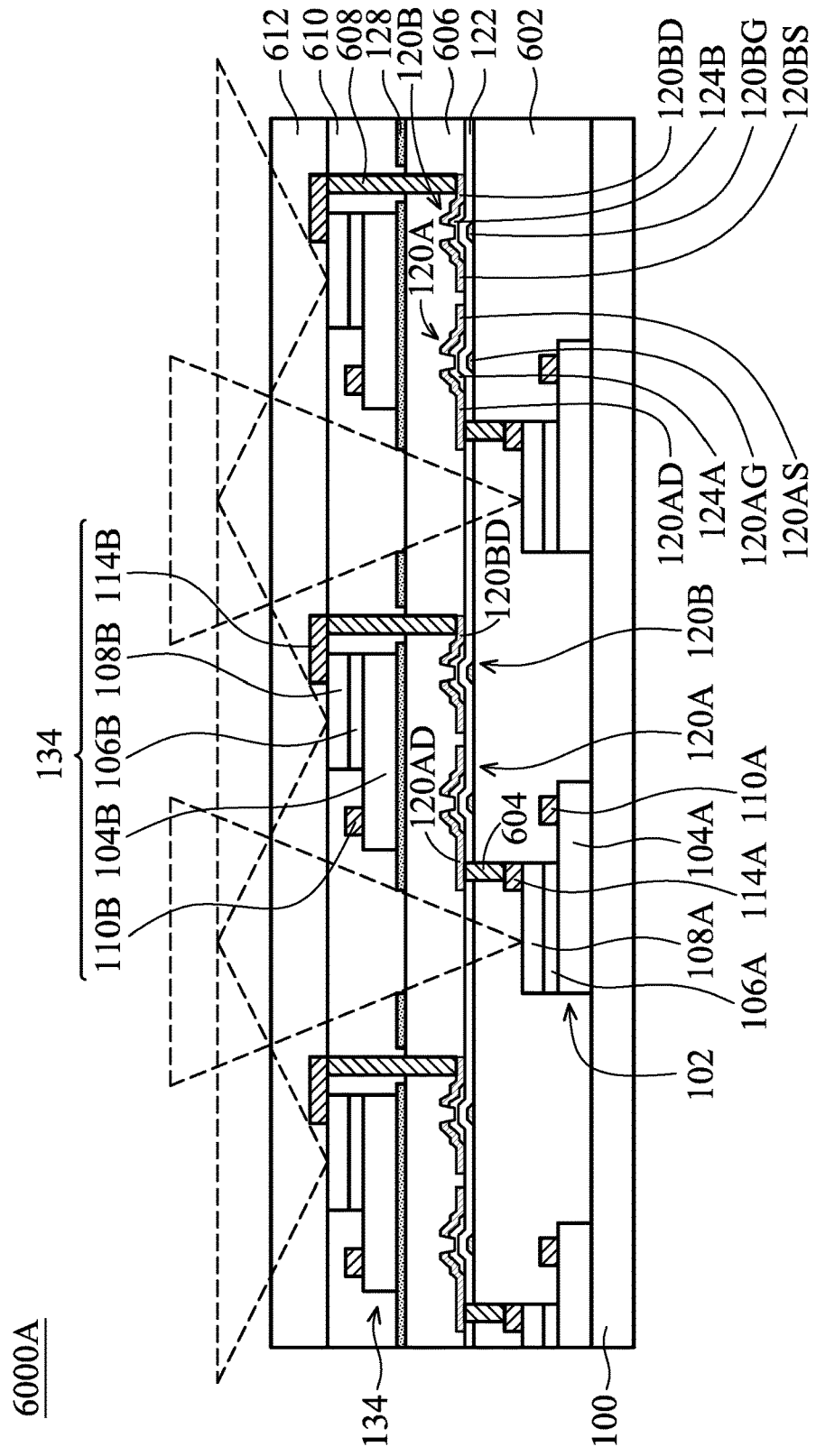
FIG. 6A is a cross-sectional view of a display device in accordance with some other embodiments of the present disclosure.

It should be noted that the exemplary embodiments set forth in FIGS. 1A-5B are merely for the purpose of illustration, and the scope of the embodiments of the present disclosure is not limited to this. In addition to the embodiments set forth in FIGS. 1A-5B, the display devices of the present disclosure have other configurations as shown in FIG. 6A. This will be described in detail in the following description. Therefore, the scope of the present disclosure is not limited to the exemplary embodiments shown in FIGS. 1A-5B.

FIG. 6A is a cross-sectional view of a display device 6000A in accordance with some other embodiments of the present disclosure. The difference between the embodiments shown in FIGS. 6A and 1A-5B is that the lower electrode 110A of the first light-emitting diode element 102 and the lower electrode 110B of the second light-emitting diode element 134 of FIG. 6A are both connected to the same common voltage Vcom3. The upper electrode 114A of the first light-emitting diode element 102 is coupled to the first drain electrode 120AD of the first transistor 120A, and the upper electrode 114B of the second light-emitting diode element 134 is coupled to the second drain electrode 120BD of the second transistor 120B.

In detail, the display device 6000A includes a substrate 100, a first light-emitting diode element 102 disposed over the substrate 100, and an insulating layer 602 disposed over the substrate 100 and covering the first light-emitting diode element 102. The display device 6000A further includes a first transistor 120A and a second transistor 120B disposed over the insulating layer 602.

The first transistor 120A includes a first gate electrode 120AG, a first semiconductor layer 124A, a first source electrode 120AS, and a first drain electrode 120AD. The first drain electrode 120AD of the first transistor 120A is electrically connected to the upper electrode 114A (or the second semiconductor layer 108A) of the first light-emitting diode element 102 through a via 604.

In addition, as shown in FIG. 6A, the second transistor 120B includes a second gate electrode 120BG, a second semiconductor layer 124B, a second source electrode 120BS, and a second drain electrode 120BD.

Still referring FIG. 6A, the display device 6000A further includes an insulating layer 606 disposed over the insulating layer 602 and covering the first transistor 120A and the second transistor 120B, and a shielding layer 128 disposed over the insulating layer 606. The display device 6000A further includes a second light-emitting diode element 134 disposed the shielding layer 128, and an upper electrode 114B of the second light-emitting diode element 134 is electrically connected to the second drain electrode 120BD of the second transistor 120B through the via 608.

Still referring to FIG. 6A, the display device 6000A further includes an insulating layer 610 disposed over the insulating layer 606 and the shielding layer 128 and surrounding the second light-emitting diode element 134, and an insulating layer 612 disposed over the insulating layer 610 and covering the second light-emitting diode element 134.

As shown in FIG. 6A, in some embodiment of the present disclosure, the first light-emitting diode element 102 and the second light-emitting diode element 134 are respectively controlled to emit light or not by two different and independent transistors.

Figure 6B:
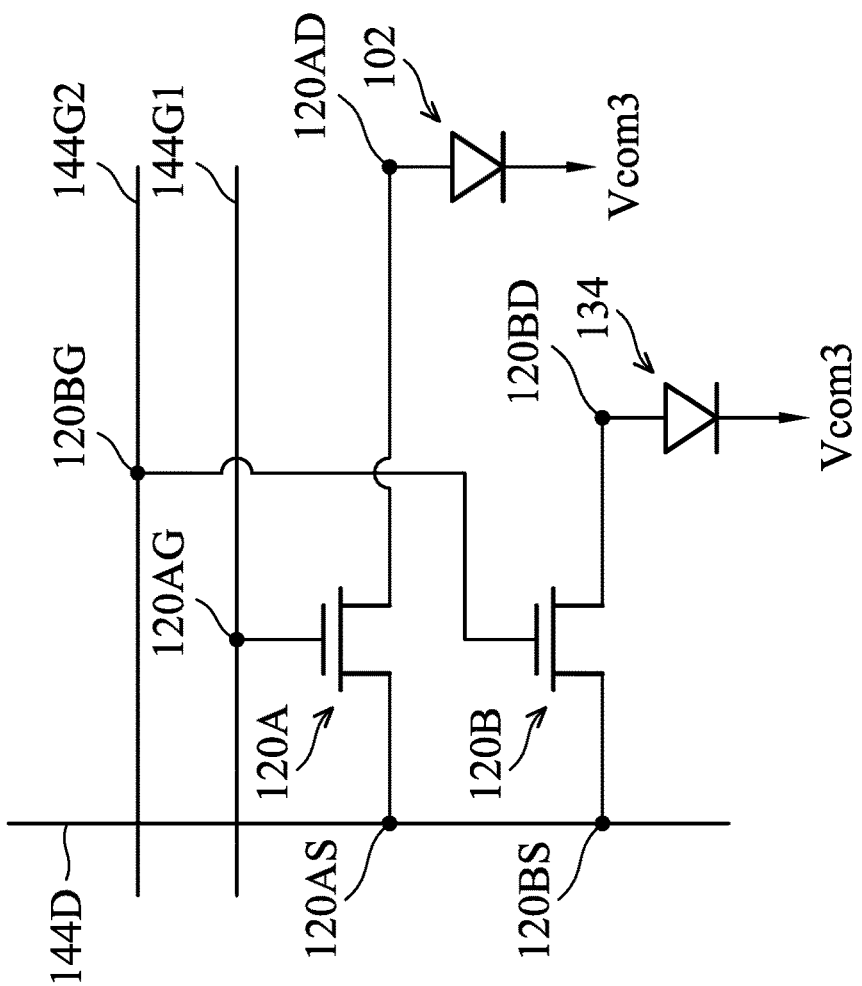
FIG. 6B is an equivalent circuit diagram of a display device in accordance with some other embodiments of the present disclosure.

FIG. 6B is an equivalent circuit diagram of the display device 6000A in accordance with some other embodiments of the present disclosure. As shown in FIG. 6B, in some embodiments of the present disclosure, the display device 6000A includes a first gate line 144G1, a second gate line 144G2, and a data line 144D. The gate electrode 120AG of the first transistor 120A is coupled to the first gate line 144G1, and the first source electrode 120AS of the first transistor 120A is coupled to the data line 144D. In addition, the first drain electrode 120AD of the first transistor 120A is coupled to one end of the first light-emitting diode element 102. The end of the first light-emitting diode element 102 is, for example, the upper electrode 114A or the second semiconductor layer 108A of the first light-emitting diode element 102. In addition, another end (such as the lower electrode 110A or the first semiconductor layer 104A) of the first light-emitting diode element 102 is coupled to the common voltage Vcom3.

In addition, as shown in FIG. 6B, the second gate electrode 120BG of the second transistor 120B is coupled to the second gate line 144G2, and the second source electrode 120BS of the second transistor 120B is coupled to the data line 144D. In addition, the second drain electrode 120BD of the second transistor 120B is coupled to one end of the second light-emitting diode element 134. The end of the second light-emitting diode element 134 is, for example, the upper electrode 114B or the second semiconductor layer 108B of the second light-emitting diode element 134. In addition, another end (such as the lower electrode 110B or the second semiconductor layer 104B) of the second light-emitting diode element 134 is coupled to the common voltage Vcom3.

In some embodiments of the present disclosure, the first light-emitting diode element 102 and the second light-emitting diode element 134 are independently controlled to emit light or not by controlling signals of the first gate line 144G1 and the second gate line 144G2.

Figure 6C:
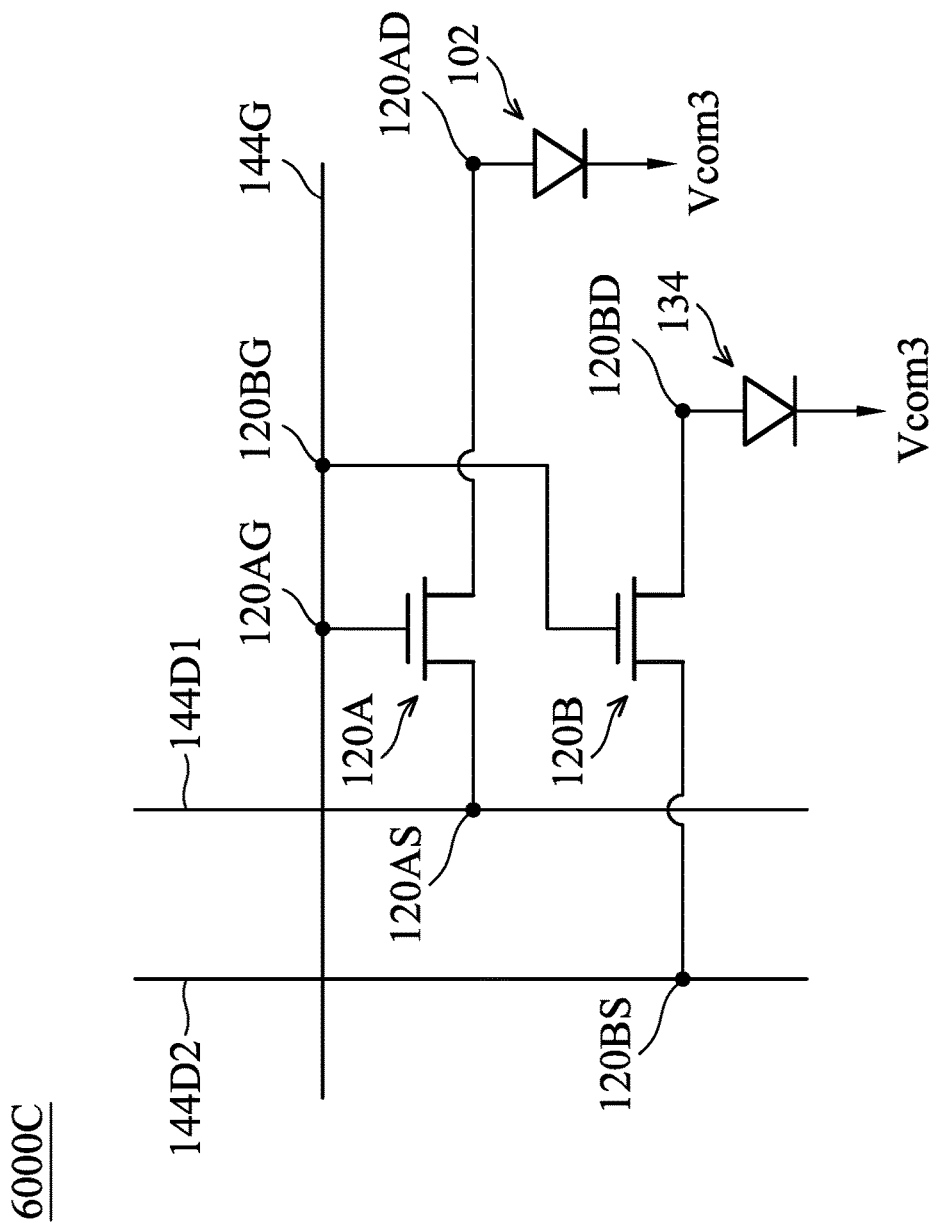
FIG. 6C is an equivalent circuit diagram of a display device in accordance with some other embodiments of the present disclosure.

FIG. 6C is an equivalent circuit diagram of a display device 6000C in accordance with some other embodiments of the present disclosure. As shown in FIG. 6C, in some embodiments of the present disclosure, the display device 6000C includes a gate line 144G, a first data line 144D1 and a second data line 144D2. The first gate electrode 120AG of the first transistor 120A is coupled to the gate line 144G, and the first source electrode 120AS of the first transistor 120A is coupled to the first data line 144D1. In addition, the first drain electrode 120AD of the first transistor 120A is coupled to one end of the first light-emitting diode element 102. The end of the first light-emitting diode element 102 is, for example, the upper electrode 114A or the second semiconductor layer 108A of the first light-emitting diode element 102. In addition, another end (such as the lower electrode 110A or the first semiconductor layer 104A) of the first light-emitting diode element 102 is coupled to the common voltage Vcom3.

In addition, as shown in FIG. 6C, the second gate electrode 120BG of the second transistor 120B is coupled to the gate line 144G, and the second source electrode 120BS of the second transistor 120B is coupled to the second data line 144D2. In addition, the second drain electrode 120BD of the second transistor 120B is coupled to one end of the second light-emitting diode element 134. The end of the second light-emitting diode element 134 is, for example, the upper electrode 114B or the second semiconductor layer 108B of the second light-emitting diode element 134. In addition, another end (such as the lower electrode 110B or the second semiconductor layer 104B) of the second light-emitting diode element 134 is coupled to the common voltage Vcom3.

In some embodiments of the present disclosure, the first light-emitting diode element 102 and the second light-emitting diode element 134 are independently controlled to emit light or not by controlling the signals of the first data line 144D1 and the second data line 144D2.

Figure 7A:
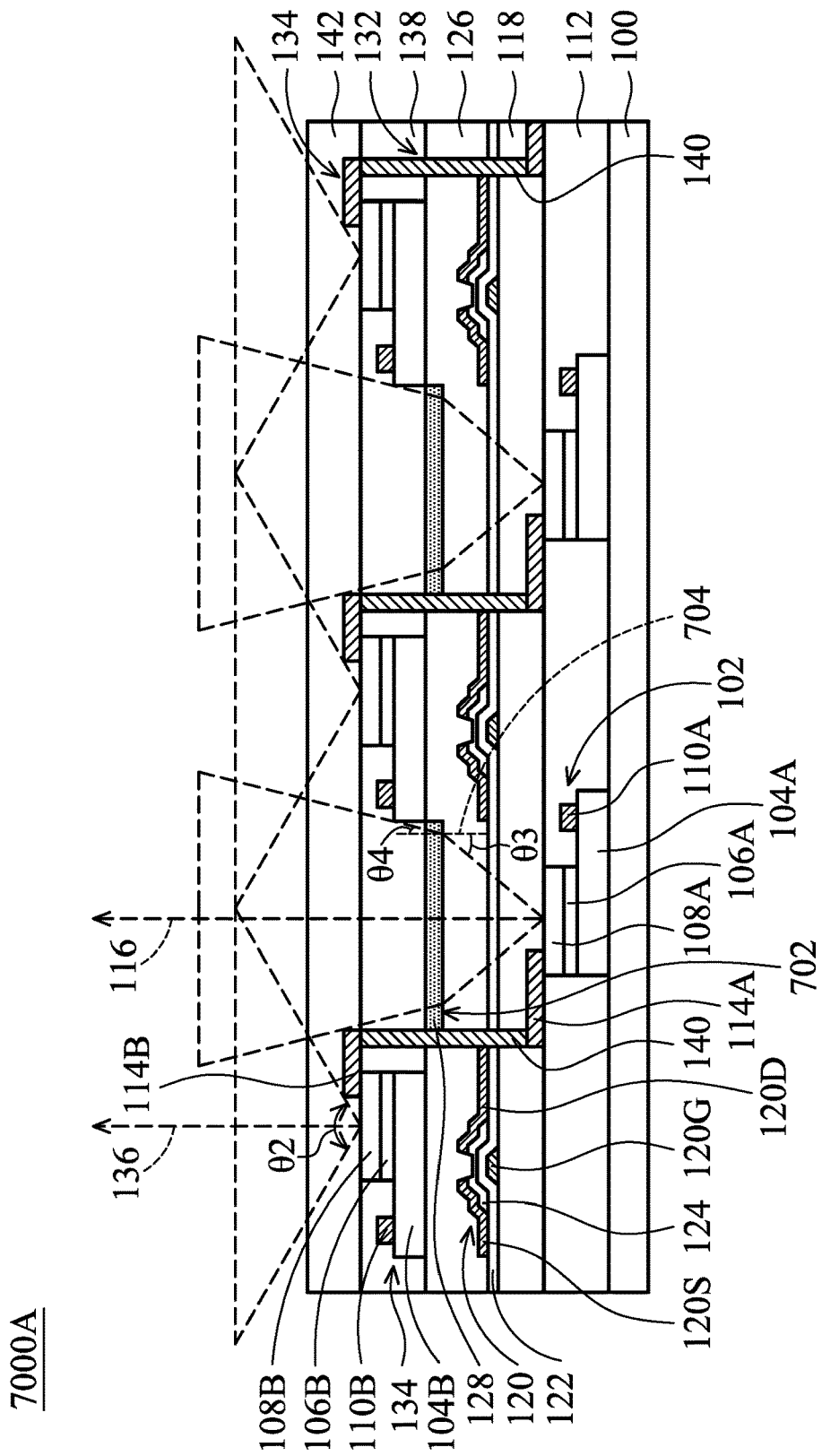
FIG. 7A is a cross-sectional view of a display device in accordance with some other embodiments of the present disclosure.
Figure 7B:
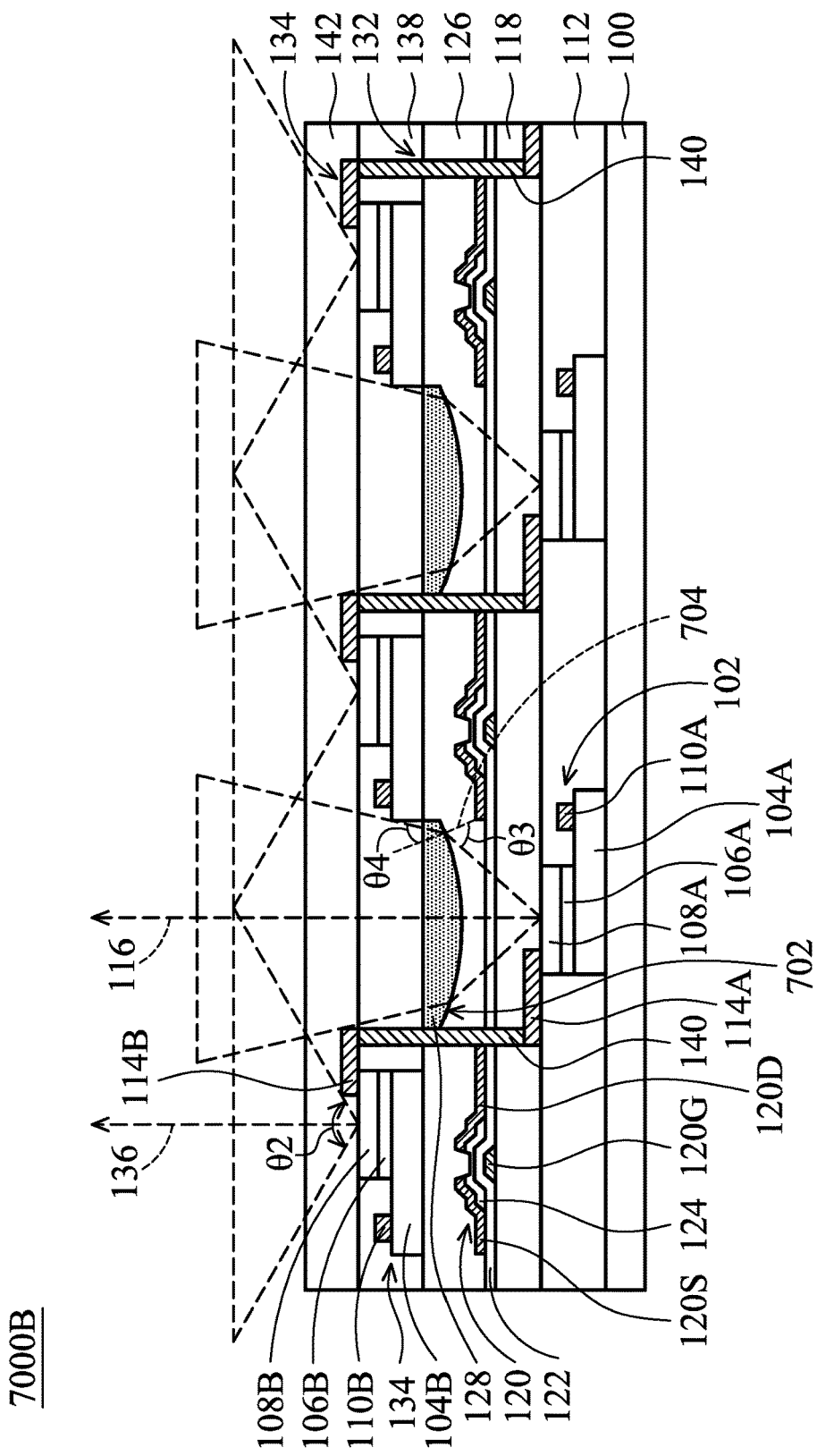
FIG. 7B is a cross-sectional view of a display device in accordance with some other embodiments of the present disclosure.
Figure 7C:
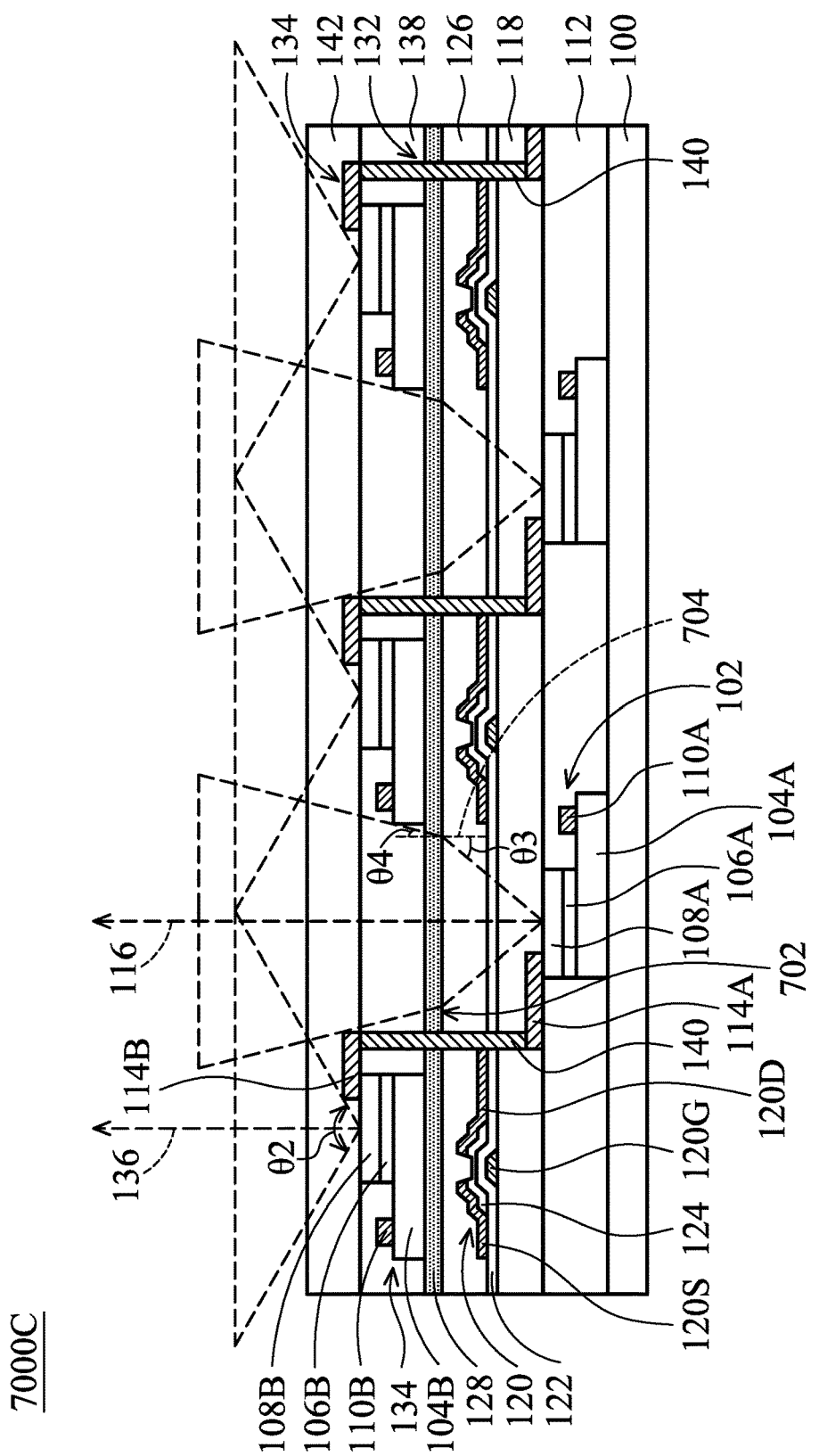
FIG. 7C is a cross-sectional view of a display device in accordance with some other embodiments of the present disclosure.

It should be noted that the exemplary embodiments set forth in FIGS. 1A-6C are merely for the purpose of illustration, and the scope of the embodiments of the present disclosure is not limited to this. In addition to the embodiments set forth in FIGS. 1A-6C, the display devices of the present disclosure have other configurations as shown in FIGS. 7A-7C. This will be described in detail in the following description. Therefore, the scope of the present disclosure is not limited to the exemplary embodiments shown in FIGS. 1A-6C.

FIG. 7A is a cross-sectional view of a display device 7000A in accordance with some other embodiments of the present disclosure. As shown in FIG. 7A, in accordance with some embodiments of the present disclosure, the light-emitting angle changing layer 128 may be a light-transmissive film layer (also referred to as a light-transmitting layer). As shown in FIG. 7A, the light-emitting angle changing layer 128 is disposed over the first light-emitting diode element 102, and the light-emitting angle changing layer 128 is at the position corresponding to the first light-emitting path 116 of the first light-emitting diode element 102.

As shown in FIG. 7A, the light-emitting angle changing layer 128 is in direct contact with an insulating layer 126, and there is an interface 702 between the light-emitting angle changing layer 128 and the insulating layer 126. In addition, the refractive index of the light-emitting angle changing layer 128 is different from that of the insulating layer 126. In detail, the light-emitting angle changing layer 128 has a first refractive index n1, the insulating layer 126 has a second refractive index n2, and the first refractive index n1 is greater than the second refractive index n2.

In addition, as shown in FIG. 7A, the light being emitted from the first light-emitting diode element 102 has an incident angle θ3 and a refractive angle θ4 at the interface 702. In some embodiments of the present disclosure, the incident angle θ3 is in the insulating layer 126, and incident angle θ3 is the angle between the normal line 704 of the interface 702 and the light being emitted from the first light-emitting diode element 102. The refraction angle θ4 is in the light-emitting angle changing layer 128, and the refractive angle θ4 is the angle between the normal line 704 of the interface 702 and the light being emitted from the first light-emitting diode element 102.

In accordance with Snell's Law, the first refractive index n1, the second refractive index n2, the incident angle θ3 and the refractive angle θ4 may be expressed by the following formula:

$$n1 \sin \theta1 = n2 \sin \theta2$$

From Snell's Law, it could be known that since the first refractive index n1 of the light-emitting angle changing layer 128 is greater than the second refractive index n2 of the insulating layer 126 in embodiments of the present disclosure, the refractive angle θ4 is smaller than the incident angle θ3. Therefore, the light-emitting angle of the first light-emitting diode element 102 may be reduced by the light-emitting angle changing layer 128, and thereby the viewing angle of the display device is narrowed. In some embodiment of the present disclosure, the first light-emitting angle θ1 of the first light-emitting diode element 102 is referred to which twice the refractive angle θ4. In addition, the second light-emitting angle θ2 of the second light-emitting diode element 134 is greater than the first light-emitting angle θ1 of the first light-emitting diode element 102 (i.e. greater than twice the refractive angle θ4).

In some embodiments of the present disclosure, the bottom surface of the light-emitting angle changing layer 128 is a planar surface and is parallel to the surface of the substrate 100. In other words, the interface 702 between the light-emitting angle changing layer 128 and the insulating layer 126 is a planar surface and is parallel to the surface of the substrate 100.

In some embodiments of the present disclosure, the light-emitting angle changing layer 128 may be made of a dielectric material, such as silicon dioxide, silicon nitride, silicon oxynitride, or any other suitable material. In addition, in some embodiments of the present disclosure, the light-emitting angle changing layer 128 may be formed using the following methods. First, a recess is formed by etching the insulating layer 126, and the bottom surface of the recess is a planar surface. Next, the dielectric material is deposited in the recess by the deposition steps described previously to form the light-emitting angle changing layer 128.

Alternatively, in some embodiments of the present disclosure, the light-emitting angle changing layer 128 may also be formed by other methods. In some other embodiments of the present disclosure, the insulating layer 126 may be composed of double layered or multi-layered insulating layers (not shown). The lower layer of the insulating layers may be formed first. After that, the light-emitting angle changing layer 128 is formed over the lower layer of the insulating layers. Next, the upper layer of the insulating layers is formed, and the upper layer of the insulating layers surrounds the light-emitting angle changing layer 128.

FIG. 7B is a cross-sectional view of a display device 7000B in accordance with some other embodiments of the present disclosure. The difference between the embodiments shown in FIGS. 7B and 7A is that the bottom surface of the light-emitting angle changing layer 128 of FIG. 7B is a curved surface. In other words, the interface 702 between the light-emitting angle changing layer 128 and the insulating layer 126 is a curved surface.

In some embodiments of the present disclosure, the light-emitting angle changing layer 128 may be formed using the following methods. First, a recess is formed by etching the insulating layer 126, and the bottom surface of the recess is a curved surface. Next, the dielectric material is deposited in the recess by the previously described deposition steps to form the light-emitting angle changing layer 128.

FIG. 7C is a cross-sectional view of a display device 7000C in accordance with some other embodiments of the present disclosure. The difference between the embodiments shown in FIGS. 7C and 7A-7B is that the light-emitting angle changing layer 128 of FIG. 7C is formed over the insulating layer 126 instead of formed in the insulating layer 126.

In detail, after formation of the insulating layer 126, the light-emitting angle changing layer 128 is formed over the insulating layer 126. After that, the second light-emitting diode element 134 is placed or formed over the light-emitting angle changing layer 128. As shown in FIG. 7C, the light-emitting angle of the first light-emitting diode element 102 may be reduced by the light-emitting angle changing layer 128, and thereby the viewing angle of the display device is narrowed.

In summary, the embodiments of the present disclosure may give the display devices of the present disclosure the ability of switching between wide and narrow viewing angles by disposing two light-emitting diode elements having different light-emitting angles in a display device, and thereby the embodiments of the present disclosure can significantly increase the number of applications of the display devices.

In addition, in some embodiments of the present disclosure, the display devices further have the function of displaying 3D image by disposing two light-emitting diode elements at two different layers respectively in the display devices, and thereby the embodiments of the present disclosure can further increase the applicability of the display devices.

In addition, it should be noted that the person skilled in the art knows that the drain and source mentioned above in the present disclosure are interchangeable since the definition of the drain and source is related to the voltage connected thereto.

Note that the aforementioned element sizes, element parameters, and element shapes are not limitations of the present disclosure. Those skilled in the art can adjust these settings or values according to different requirements. It is understood that the display devices and methods for manufacturing the same of the present disclosure are not limited to the configurations of FIGS. 1A to 7C. The present disclosure may merely include any one or more features of any one or more embodiments of FIGS. 1A to 7C. In other words, not all of the features shown in the figures should be implemented at the same time in the display devices and methods for manufacturing the same of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
a substrate;
a first light-emitting diode element disposed over the substrate and having a first light-emitting path;
a light-emitting angle changing layer disposed over the first light-emitting diode element;
a second light-emitting diode element disposed over the substrate and disposed at a position other than the region corresponding to the first light-emitting path,
wherein the first light-emitting diode element has a first light-emitting angle and the second light-emitting diode element has a second light-emitting angle, and the second light-emitting angle is greater than the first light-emitting angle and wherein the first light-emitting diode element comprises a first electrode and a second electrode, and the second light-emitting diode element comprises a third electrode and a fourth electrode;
a transistor disposed over the substrate and having a drain electrode, wherein the drain electrode is electrically connected to the first electrode of the first light-emitting diode element and the third electrode of the second light-emitting diode element,
wherein the second electrode of the first light-emitting diode element is electrically connected to a first voltage;
wherein the fourth electrode of the second light-emitting diode element is electrically connected to a second voltage;
a first insulating layer disposed over the substrate and surrounding the first light-emitting diode element;
a second insulating layer disposed over the first insulating layer and covering the first light-emitting diode element, wherein the transistor is disposed over the second insulating layer; and
a third insulating layer disposed over the second insulating layer and covering the transistor, wherein the light-emitting angle changing layer is disposed over the third insulating layer, and the second light-emitting diode element is disposed over the light-emitting angle changing layer,
wherein the light-emitting angle changing layer is a shielding layer and has a first opening, and the first opening is disposed aligning to the first light-emitting path of the first light-emitting diode element.

2. A method of manufacturing a display device, comprising:
providing a substrate;
forming or placing a first light-emitting diode element over the substrate, wherein the first light-emitting diode element has a first light-emitting path;
forming a light-emitting angle changing layer over the first light-emitting diode element;
placing a second light-emitting diode element over the substrate, wherein the second light-emitting diode element is at a position other than the region corresponding to the first light-emitting path,
wherein the first light-emitting diode element has a first light-emitting angle, the second light-emitting diode element has a second light-emitting angle, and the second light-emitting angle is greater than the first light-emitting angle and wherein the first light-emitting diode element comprises a first electrode and a second electrode, and the second light-emitting diode element comprises a third electrode and a fourth electrode;
forming a transistor over the substrate, wherein the transistor has a drain electrode, and the drain electrode is electrically connected to the first electrode of the first light-emitting diode element and the third electrode of the second light-emitting diode element;
wherein the second electrode of the first light-emitting diode element is electrically connected to a first voltage;
wherein the fourth electrode of the second light-emitting diode element is electrically connected to a second voltage;

forming a first insulating layer over the substrate, wherein the first insulating layer surrounds the first light-emitting diode element;

forming a second insulating layer over the first insulating layer, wherein the second insulating layer covers the first light-emitting diode element, and the transistor is disposed over the second insulating layer; and forming a third insulating layer over the second insulating layer, wherein the third insulating layer covers the transistor, the light-emitting angle changing layer is disposed over the third insulating layer, and the second light-emitting diode element is disposed over the light-emitting angle changing layer, wherein the light-emitting angle changing layer is a shielding layer and has a first opening, and the first opening is disposed aligning to the first light-emitting path of the first light-emitting diode element.

* * * * *